(12) United States Patent
Obu et al.

(10) Patent No.: US 9,997,516 B2
(45) Date of Patent: Jun. 12, 2018

(54) SEMICONDUCTOR DEVICE AND POWER AMPLIFIER CIRCUIT

(71) Applicant: MURATA MANUFACTURING CO., LTD., Kyoto-fu (JP)

(72) Inventors: Isao Obu, Nagaokakyo (JP); Shigeru Yoshida, Nagaokakyo (JP); Kaoru Ideno, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days. days.

(21) Appl. No.: 15/446,785

(22) Filed: Mar. 1, 2017

(65) Prior Publication Data

US 2017/0359030 A1 Dec. 14, 2017

(30) Foreign Application Priority Data

Jun. 8, 2016 (JP) .................................. 2016-114537

(51) Int. Cl.
*H01L 27/082* (2006.01)
*H01L 29/737* (2006.01)
*H03F 3/195* (2006.01)
*H03F 3/213* (2006.01)
*H01L 23/66* (2006.01)
(Continued)

(52) U.S. Cl.
CPC ............ *H01L 27/082* (2013.01); *H01L 23/66* (2013.01); *H01L 29/045* (2013.01); *H01L 29/737* (2013.01); *H03F 1/0238* (2013.01); *H03F 3/195* (2013.01); *H03F 3/213* (2013.01); *H03F 2200/451* (2013.01)

(58) Field of Classification Search
None
See application file for complete search history.

(56) References Cited

U.S. PATENT DOCUMENTS

| 6,611,008 B2 * | 8/2003 | Twynam | H01L 29/0817 257/197 |
| 7,256,434 B2 * | 8/2007 | Ohbu | H01L 27/0605 257/164 |

(Continued)

FOREIGN PATENT DOCUMENTS

| JP | 2006-032450 A | 2/2006 |
| JP | 2008-035487 A | 2/2008 |

OTHER PUBLICATIONS

Cui, Jie, et al. "A High-Linearity InGaP/GaAs HBT Power Amplifier for IEEE 802.11a/n." Journal of Semiconductors, vol. 34, No. 6, 2013, p. 065001, doi:10.1088/1674-4926/34/6/065001.*
(Continued)

Primary Examiner — Joseph Schoenholtz
(74) Attorney, Agent, or Firm — Studebaker & Brackett PC

(57) ABSTRACT

A semiconductor device includes a semiconductor substrate and first and second bipolar transistors. The semiconductor substrate includes first and second main surfaces opposing each other. The first bipolar transistor is formed on the first main surface of the semiconductor substrate and includes a first emitter layer. The second bipolar transistor is formed on the first main surface of the semiconductor substrate and includes a second emitter layer and a resistor layer. The resistor layer is stacked on the second emitter layer in a direction normal to the first main surface.

12 Claims, 22 Drawing Sheets

(51) Int. Cl.
  *H03F 1/02*      (2006.01)
  *H01L 29/04*     (2006.01)

(56) References Cited

U.S. PATENT DOCUMENTS

| | | | |
|---|---|---|---|
| 7,622,756 B2 * | 11/2009 | Sasaki | H01L 23/66 |
| | | | 257/205 |
| 2005/0156194 A1 * | 7/2005 | Ohbu | H01L 27/0605 |
| | | | 257/197 |
| 2006/0138460 A1 * | 6/2006 | Sasaki | H01L 23/66 |
| | | | 257/197 |
| 2017/0236925 A1 * | 8/2017 | Zampardi | H01L 29/737 |
| | | | 257/197 |

OTHER PUBLICATIONS

Lin, Chien-Cheng, and Yu-Cheng Hsu. "Single-Chip Dual-Band WLAN Power Amplifier Using InGaP/GaAs HBT." 2005 European Microwave Conference, 2005, doi:10.1109/eumc.2005.1610219.*

* cited by examiner

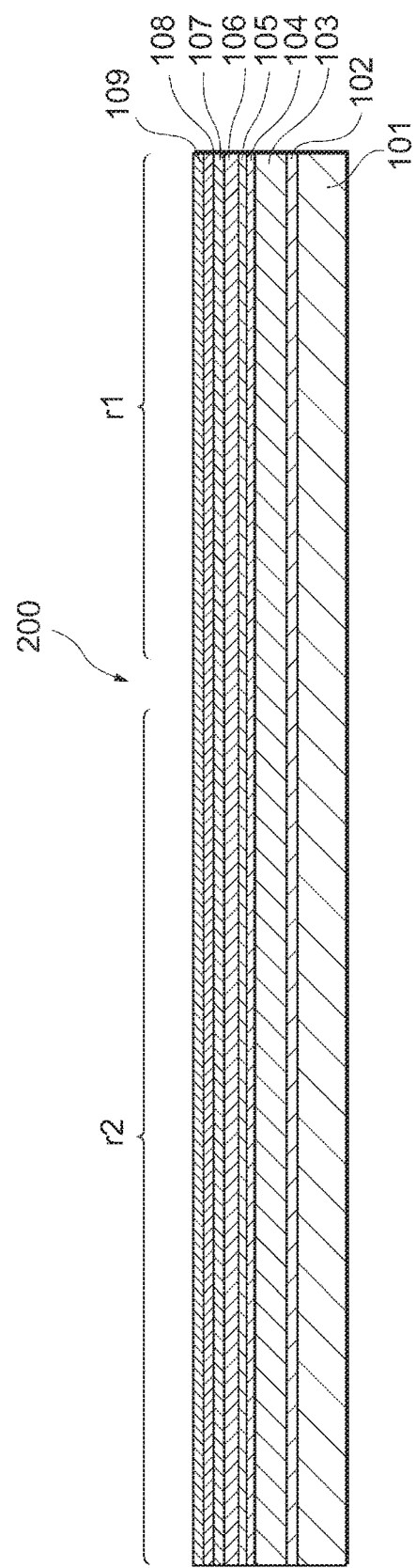

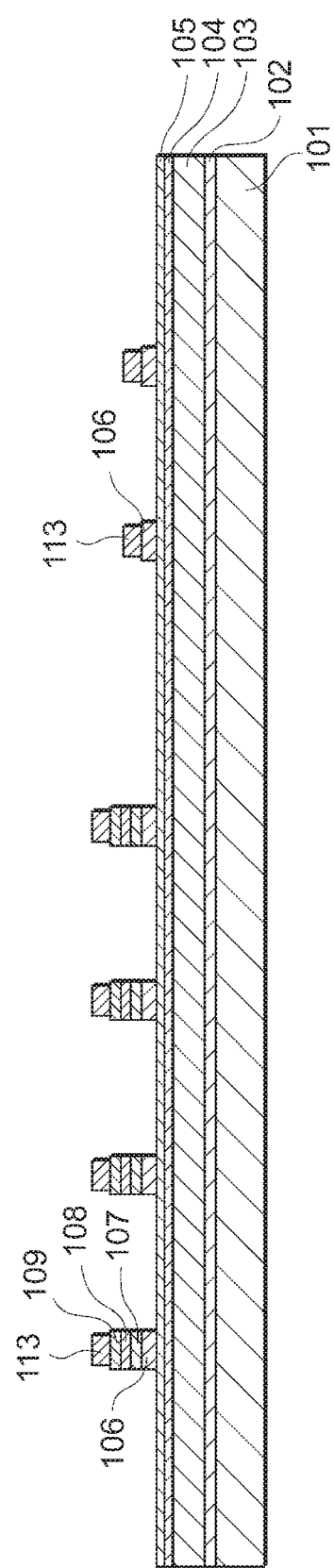

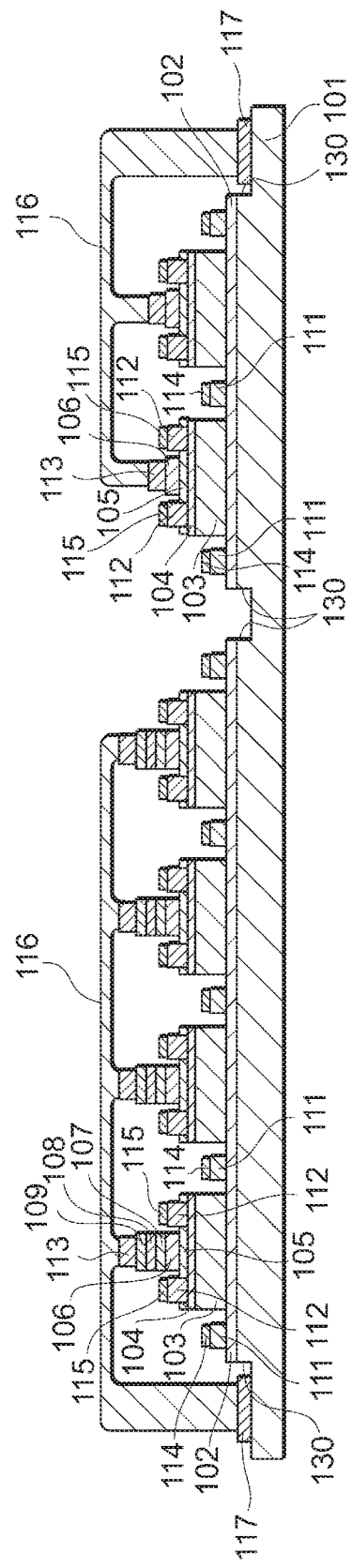

SEMICONDUCTOR DEVICE AND POWER AMPLIFIER CIRCUIT

CROSS REFERENCE TO RELATED APPLICATIONS

This application claims benefit of priority to Japanese Patent Application 2016-114537 filed Jun. 8, 2016, the entire content of which is incorporated herein by reference.

TECHNICAL FIELD

The present disclosure relates to a semiconductor device and a power amplifier circuit.

BACKGROUND

In mobile communication devices such as cellular phones, a power amplifier circuit is used for amplifying power of a radio frequency (RF) signal to be transmitted to a base station. In a power amplifier circuit, a heterojunction bipolar transistor (HBT) which exhibits high power-added efficiency and linearity is commonly used as an amplifier element. For example, Japanese Unexamined Patent Application Publication No. 2008-35487 discloses a power amplifier circuit in which a first HBT (Q1) operating as class B to AB and a second HBT (Q2) operating as class C are connected in parallel with each other on the same semiconductor chip.

SUMMARY

In the configuration disclosed in this publication, in the low power output, the first HBT (Q1) is solely operated, and as the collector voltage of the second HBT (Q2) rises in accordance with an increase in the output power, the second HBT (Q2) is also operated. In this manner, the high power-added efficiency is achieved both in the high power output and in the low power output. In this configuration, however, the HBTs may be broken due to a rise in the collector voltage of the second HBT (Q2) in the high power output. Thus, the reliability of the power amplifier circuit is not sufficiently high.

The present disclosure has been made in view of this background. It is an object of the disclosure to provide a semiconductor device exhibiting higher reliability while maintaining the high power-added efficiency both in the high power output and in the low power output.

According to preferred embodiments of the present disclosure, there is provided a semiconductor device including a semiconductor substrate and first and second bipolar transistors. The semiconductor substrate includes first and second main surfaces opposing each other. The first bipolar transistor is formed on the first main surface of the semiconductor substrate and includes a first emitter layer. The second bipolar transistor is formed on the first main surface of the semiconductor substrate and includes a second emitter layer and a resistor layer. The resistor layer is stacked on the second emitter layer in a direction normal to the first main surface.

According to preferred embodiments of the present disclosure, it is possible to provide a semiconductor device exhibiting higher reliability while maintaining the high power-added efficiency both in the high power output and in the low power output.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIGS. 7A through 7K are sectional views illustrating the individual steps of a manufacturing method for the semiconductor device according to the first embodiment.

DETAILED DESCRIPTION

Figure 1:
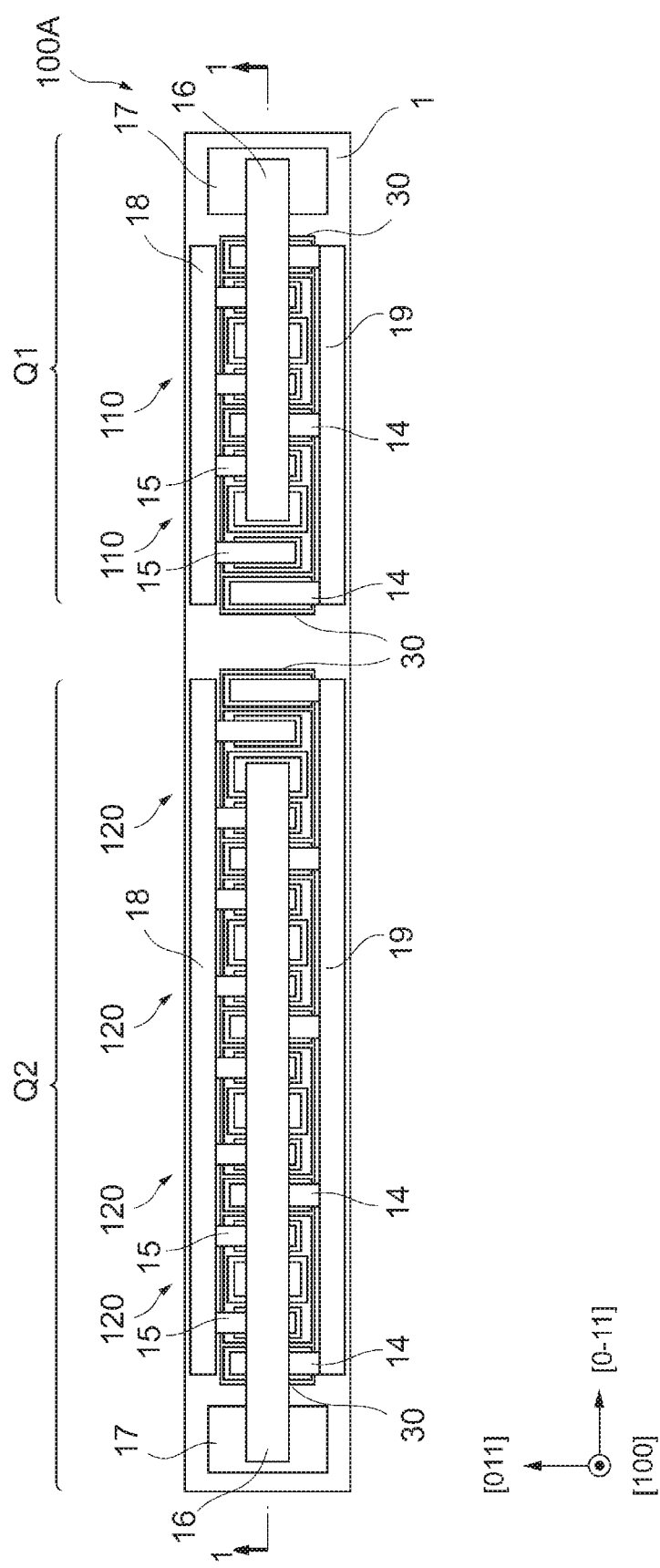
FIG. 1 is a plan view of a semiconductor device according to a first embodiment of the disclosure.

Preferred embodiments of the present disclosure will be described below in detail with reference to the accompanying drawings. The same element is designated by a like reference numeral, and an explanation thereof will be given only once.

(First Embodiment)

Figure 2:
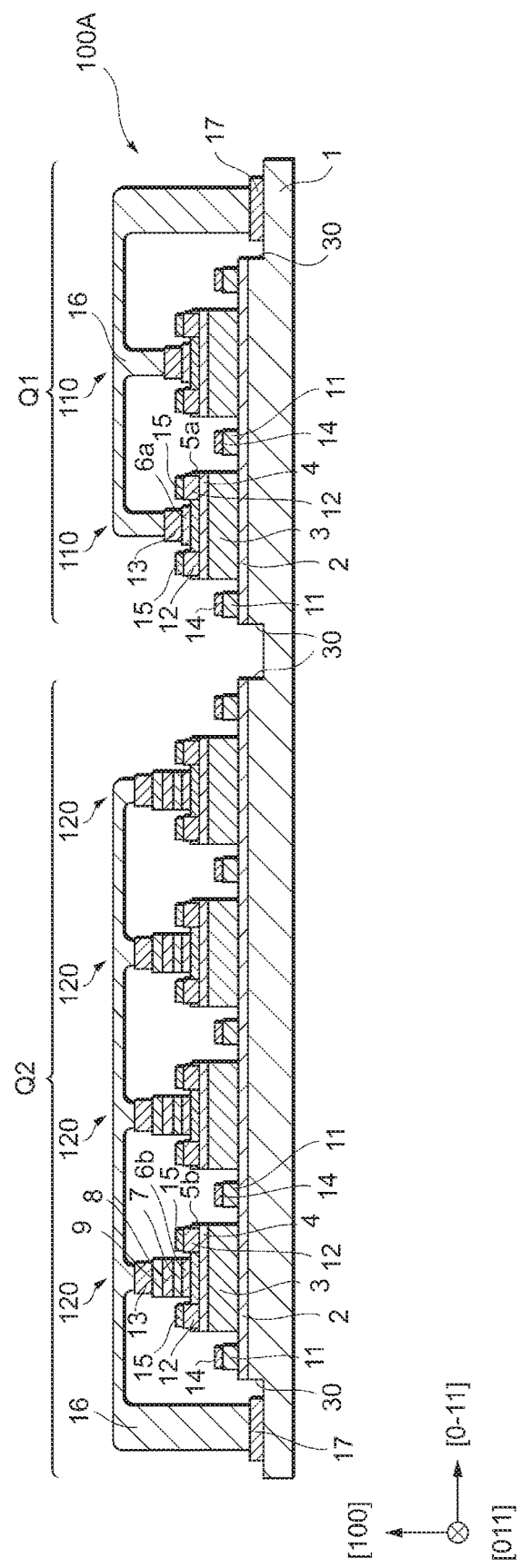
FIG. 2 is a sectional view taken along line 1-1 in FIG. 1.

A semiconductor device 100A according to a first embodiment of the disclosure will be described below with reference to FIGS. 1 and 2. FIG. 1 is a plan view of the semiconductor device 100A, and FIG. 2 is a sectional view taken along line 1-1 in FIG. 1.

As shown in FIG. 1, the semiconductor device 100A includes a semiconductor substrate 1 and unit transistors 110 and 120. In FIGS. 1 and 2, two unit transistors 110 and four unit transistors 120 are shown for the sake of description. However, the number of transistors 110 and 120 are not restricted to these values.

The semiconductor substrate 1 is made of gallium arsenide (GaAs), for example. The semiconductor substrate 1 has a longitudinal direction parallel with a crystal orientation [0-11], a widthwise direction parallel with a crystal orientation [011], and a thickness direction parallel with a crystal orientation [100] (see FIG. 1) in accordance with the crystal orientations of GaAs. The semiconductor substrate 1 also has first and second main surfaces opposing each other. The first main surface is parallel with a plane orientation (100) and has a substantially rectangular shape. In this specification, for the sake of convenience, a coordinate on the negative side is represented by a negative sign such as "-1" instead of by an overline. The configurations of the elements of the semiconductor device 100A will be discussed below based on these crystal orientations. The material for the semiconductor substrate 1 is not restricted to GaAs, and may be Si, InP, SiC, or GaN.

On the first main surface (in the [100] direction) of the substantially planar semiconductor substrate 1, the plural unit transistors 110 and 120 are formed. The plural unit transistors 110 are connected in parallel with each other so as to form a HBT (Q1) (first bipolar transistor). The plural unit transistors 120 are connected in parallel with each other so as to form a HBT (Q2) (second bipolar transistor). The numbers of parallel-connected unit transistors 110 and 120 (that is, the number of fingers of each HBT) are not restricted to particular values. In the example shown in FIG. 1, on the single semiconductor substrate 1, the plural unit transistors 110 are arranged in the [0-11] direction, while the plural unit transistors 120 are arranged in the [01-1] direction. However, the positions of the unit transistors 110 and 120 are not limited to these positions. Isolation grooves 30 are formed between the plural unit transistors 110 and the plural unit transistors 120. Details of the structures of the unit transistors 110 and 120 will be discussed below with reference to FIG. 2. In the following description, layers formed by the same step may be designated by a like reference numeral for the sake of convenience.

The unit transistor 110 is formed on the first main surface of the semiconductor substrate 1. The unit transistor 110 includes a sub-collector layer 2, a collector layer 3, a base layer 4, an emitter layer 5a, a contact layer 6a, electrodes, and wiring patterns.

On the first main surface of the semiconductor substrate 1, the sub-collector layer 2, the collector layer 3, the base layer 4, the emitter layer 5a, and the contact layer 6a are stacked on each other in a multilayer structure in this order in the [100] direction (in the direction normal to the first main surface of the semiconductor substrate 1) (see FIG. 2).

The sub-collector layer 2 is formed on the first main surface of the semiconductor substrate 1. The material for the sub-collector layer 2 is not limited to a particular material, and may be a material having a crystal structure. The sub-collector layer 2 and the collector layer 3 serve as a collector.

The collector layer 3 is formed on the sub-collector layer 2. The material for the collector layer 3 is not limited to a particular material, and may be a material having a crystal structure. In the first embodiment, the sub-collector layer 2 and the collector layer 3 contain GaAs as the principal component, for example. The crystal orientation of GaAs in the collector layer 3 is aligned with that of GaAs in the semiconductor substrate 1, for example.

The entirety of the collector layer 3 containing GaAs may be an n-type semiconductor or a p-type semiconductor. If the collector layer 3 is an n-type semiconductor, the unit transistor 110 is an npn-junction transistor. If the collector layer 3 is a p-type semiconductor, the unit transistor 110 is a pnp-junction transistor. The frequency characteristics of an npn-junction transistor are higher than those of a pnp-junction transistor because the hole mobility of GaAs (about 0.04 m$^2$/Vs) is lower than the electron mobility thereof (about 0.85 m$^2$/Vs). From this viewpoint, the collector layer 3 is preferably an n-type semiconductor. In the first embodiment, the collector layer 3 is an n-type semiconductor. To form the collector layer 3 to be an n-type semiconductor, the collector layer 3 is doped with a dopant such as Si, S, Se, Te, or Sn. To form the collector layer 3 to be a p-type semiconductor, the collector layer 3 is doped with a dopant such as C, Mg, Be, Zn, or Cd. In the first embodiment, the sub-collector layer 2 may have a Si-doping concentration of about $5\times10^{18}$ cm$^{-3}$ and a film thickness of about 0.6 μm, while the collector layer 3 may have a Si-doping concentration of about $1\times10^{16}$ cm$^{-3}$ and a film thickness of about 1.0 μm.

The base layer 4 is formed on the collector layer 3. The material for the base layer 4 is not limited to a particular material, and may be GaAs, AlGaAs, InGaAs, GaAsSb, GaAsPBi, GaInNAs, GaAsBi, GaAsN, or GaAsBiN. Alternatively, the base layer 4 may be formed as a multilayer base structure or a composition gradient base structure as a combination of these compounds. In the first embodiment, the base layer 4 is made of a material similar to that of the sub-collector layer 2 and the collector layer 3 and contains GaAs as the principal component, for example.

GaAs, which is the principal component of the base layer 4, may be an n-type semiconductor or a p-type semiconductor. In the first embodiment, since the collector layer 3 is an n-type semiconductor, GaAs forming the base layer is a p-type semiconductor. The base layer 4 may have a C-doping concentration of about $5\times10^{19}$ cm$^{-3}$ and a film thickness of about 96 nm.

The emitter layer 5a (first emitter layer) is formed on the base layer 4. The emitter layer 5a may be made of any semiconductor material. In the first embodiment, however, the emitter layer 5a is bonded to the base layer 4 in a heterojunction structure, and is thus preferably constituted by a semiconductor having a principal component that lattice-matches the principal component of the base layer 4. In the first embodiment, the emitter layer 5a is an n-type semiconductor and contains InGaP as the principal component, for example. The emitter layer 5a may have an InP mole ratio of about 0.48, a Si-doping concentration of about $4\times10^{17}$ cm$^{-3}$, and a film thickness of about 35 nm.

The contact layer 6a (first contact layer) is formed on the emitter layer 5a. The material for the contact layer 6a is not limited to a particular material, and may be GaAs, AlGaAs, or InGaAs, or may be a multilayer film as a combination of these compounds. In the first embodiment, the contact layer 6a is an n-type semiconductor and contains GaAs as the principal component, for example. The contact layer 6a may have a Si-doping concentration of about $5\times10^{18}$ cm$^{-3}$ and a film thickness of about 50 nm. The resistance of the contact layer 6a is preferably low, and the Si-doping concentration is preferably about $1\times10^{18}$ cm$^{-3}$ or higher.

A pair of collector electrodes 11 is formed with the collector layer 3 interposed therebetween on the sub-collector layer 2. More specifically, one collector electrode 11 is formed on one side of the collector layer 3 in the widthwise direction [0-11] of the sub-collector layer 2, and the other electrode 11 is formed on the other side of the collector layer 3 in the widthwise direction [01-1] of the sub-collector layer 2. The collector electrode 11 may be formed on only one side of the collector layer 3 on the sub-collector layer 2. The material for the collector electrodes 11 is not limited to a particular material, and may be Ti/Pt, Ti/Pt/Au, WSi, or AuGe/Ni/Au. In the first embodiment, the collector electrodes 11 may be made of AuGe (film thickness of about 60 nm)/Ni (film thickness of about 10 nm)/Au (film thickness of about 200 nm). The slash "/" means that these components are formed in a multilayer structure. For example, "Ti/Pt" represents a multilayer structure in which Pt is stacked on Ti. The slash "/" will also be used in a similar manner in the following description.

Base electrodes 12 are formed on the base layer 4. The material for the base electrodes 12 is not limited to a particular material, and may be Ti/Pt, Ti/Pt/Au, WSi, or AuGe/Ni/Au. In the first embodiment, the base electrodes 12 may be made of Ti (film thickness of about 50 nm)/Pt (film thickness of about 50 nm)/Au (film thickness of about 200 nm).

An emitter electrode 13 is formed on the contact layer 6a. The material for the emitter electrode 13 is not limited to a particular material, and may be Mo/Ti/Pt/Au, WSi, or AuGe/Ni/Au. In the first embodiment, the emitter electrode 13 may be made of Mo (film thickness of about 10 nm)/Ti (film thickness of about 5 nm)/Pt (film thickness of about 30 nm)/Au (film thickness of about 200 nm).

Collector wiring patterns 14, base wiring patterns 15, and an emitter wiring pattern 16 are formed on the collector electrodes 11, the base electrodes 12, and the emitter electrode 13, respectively. Metal pads 17, 18, and 19 are used for electrical connection with the outside of the HBT.

The unit transistor 120 is formed on the first main surface of the semiconductor substrate 1. The unit transistor 120 is configured similarly to the unit transistor 110, except that it has a tunneling barrier layer 7, an emitter ballast resistor layer 8, and a contact layer 9 that are stacked on each other in this order in the [100] direction between a contact layer 6b and an emitter electrode 13.

The contact layer 6b (second contact layer) is formed on an emitter layer 5b (second emitter layer). The emitter layer 5b and the contact layer 6b are similar to the emitter layer 5a and the contact layer 6a, respectively, of the unit transistor 110, and a detailed explanation thereof will thus be omitted.

The tunneling barrier layer 7 is formed on the contact layer 6b. The material for the tunneling barrier layer 7 is not limited to a particular material, and may be a material having a crystal structure. In the first embodiment, the tunneling barrier layer 7 is an n-type semiconductor and contains InGaP as the principal component, for example. The tunneling barrier layer 7 may have an InP mole ratio of about 0.48, a Si-doping concentration of about $5 \times 10^{18}$ cm$^{-3}$, and a film thickness of about 3 nm.

The emitter ballast resistor layer 8 is formed on the tunneling barrier layer 7. The material for the emitter ballast resistor layer 8 is not limited to a particular material, and may be a material having a crystal structure. In the first embodiment, the emitter ballast resistor layer 8 is an n-type semiconductor and contains AlGaAs as the principal component, for example. The emitter ballast resistor layer 8 may have an AlAs mole ratio of about 0.33, a Si-doping concentration of about $1 \times 10^{17}$ cm$^{-3}$, and a film thickness of about 120 nm. In this specification, the resistivity of the emitter ballast resistor layer 8 is higher than that of the contact layer 6b. For example, the doping concentration of the emitter ballast resistor layer 8 may be about $5 \times 10^{17}$ cm$^{-3}$ or lower. The emitter ballast resistor layer 8 may be formed as a multilayer film.

The contact layer 9 (third contact layer) is formed on the emitter ballast resistor layer 8. The material for the contact layer 9 is not limited to a particular material, and may be GaAs, AlGaAs, or InGaAs, or may be a multilayer film as a combination of these compounds, as in the contact layers 6a and 6b. In the first embodiment, the contact layer 9 is an n-type semiconductor and contains GaAs as the principal component, for example. The contact layer 9 may have a Si-doping concentration of about $5 \times 10^{18}$ cm$^{-3}$ and a film thickness of about 50 nm. The resistance of the contact layer 9 is preferably low, as in the contact layers 6a and 6b, and the Si-doping concentration is preferably about $1 \times 10^{18}$ cm$^{-3}$ or higher.

The emitter electrode 13 is formed on the contact layer 9. A low-resistance contact layer may be formed between the contact layer 9 and the emitter electrode 13. Such a low-resistance contact layer is an n-type semiconductor and contains InGaAs as the principal component, for example. The low-resistance contact layer may have an InAs mole ratio of about 0.5, a Si-doping concentration of about $1 \times 10^{19}$ cm$^{-3}$, and a film thickness of about 50 nm. The other electrodes, wiring patterns, and metal pads are similar to those of the unit transistor 110, and a detailed explanation thereof will thus be omitted.

With the above-described configuration, in the semiconductor device 100A, the unit transistors 110 without an emitter ballast resistor layer on the emitter layer 5a and the unit transistors 120 with the emitter ballast resistor layer 8 are mounted on the same substrate. If all the unit transistors on the same substrate have an emitter ballast resistor layer, the amount of collector current (which is substantially the same as the amount of emitter current) is reduced due to the insertion of the emitter ballast resistor layer particularly when the collector voltage is relatively low. Conversely, if none of the unit transistors on the same substrate have an emitter ballast resistor layer, a high current flows into collectors particularly when the collector voltage is relatively high, and the collector-emitter voltage exceeds the withstand voltage, which may break the unit transistors.

In the first embodiment, by switching the unit transistors to be operated in accordance with the collector voltage, the occurrence of a breakdown of the unit transistors can be reduced while maintaining the amplifying characteristics of the unit transistors. More specifically, when the collector voltage is relatively low, for example, when the collector voltage is equal to or lower than the withstand voltage of the transistors, the unit transistors 110 without an emitter ballast resistor layer are operated. When the collector voltage is relatively high, for example, when the collector voltage is equal to or higher than the withstand voltage of the transistors, the unit transistors 120 with the emitter ballast resistor layer 8 are operated. This configuration makes it possible to provide a semiconductor device exhibiting higher reliability while maintaining the high power-added efficiency both in the high power output and in the low power output. Due to the variations in the plural unit transistors, failures such as thermal runaway may occur in some unit transistors. In the first embodiment, the emitter ballast resistor layer 8 is provided on the same substrate as the unit transistors. It is thus less likely that thermal runaway will occur in some unit transistors than when an emitter ballast resistor is provided outside the semiconductor device 100A. This will be explained more specifically. In the HBT (Q2), the amounts of current flowing through the individual unit transistors 120 are not uniform, and the current may concentrate on some particular unit transistors 120. In this case, providing of an emitter ballast resistor outside the semiconductor device 100A merely reduces the overall amount of current flowing through the HBT (Q2) as a whole, and the amount of current concentrated on some particular unit transistors 120 is not reduced. In contrast, in the first embodiment, the emitter ballast resistor layer 8 is provided in each of the unit transistors 120 within the semiconductor device 100A, thereby effectively reducing the amount of high current concentrated on some unit transistors 120.

If the unit transistor 120 is an npn-type bipolar transistor, the film thickness of the tunneling barrier layer 7 is preferably 1 to 10 nm in terms of the passage of electrons in the quantum tunneling effect. If the unit transistor 120 is a pnp-type bipolar transistor, the film thickness of the tunneling barrier layer 7 is preferably 1 to 3 nm in terms of the passage of holes in the quantum tunneling effect.

Figure 3:
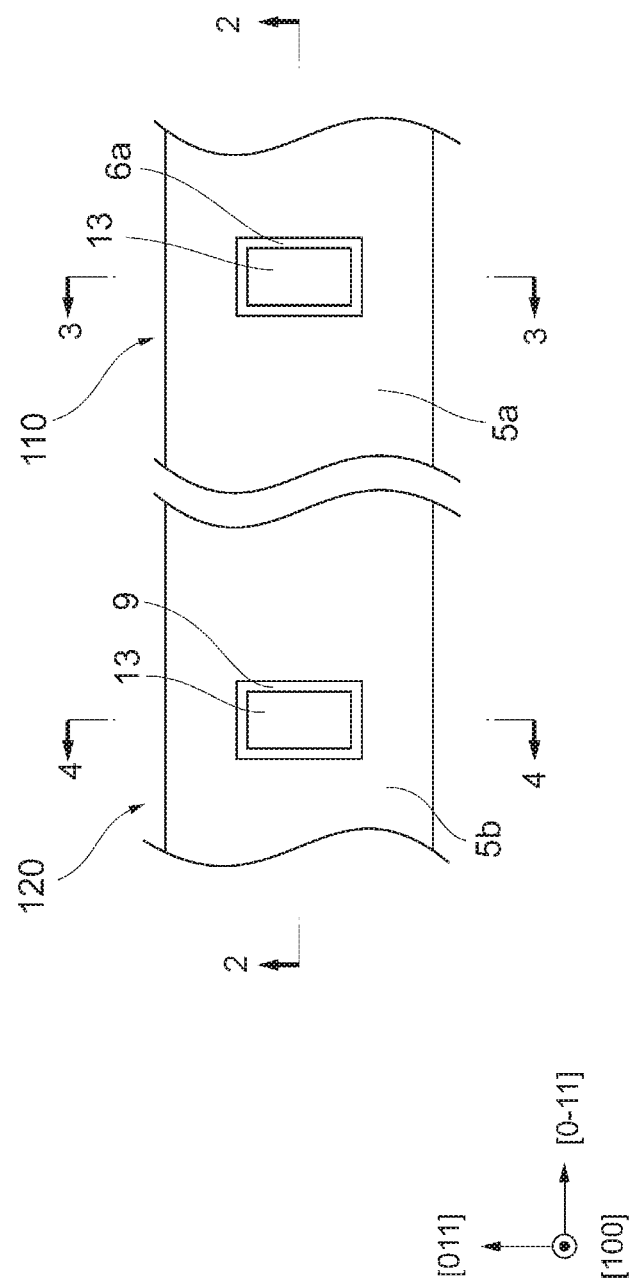
FIG. 3 is a plan view of the semiconductor device according to the first embodiment.
Figure 4:
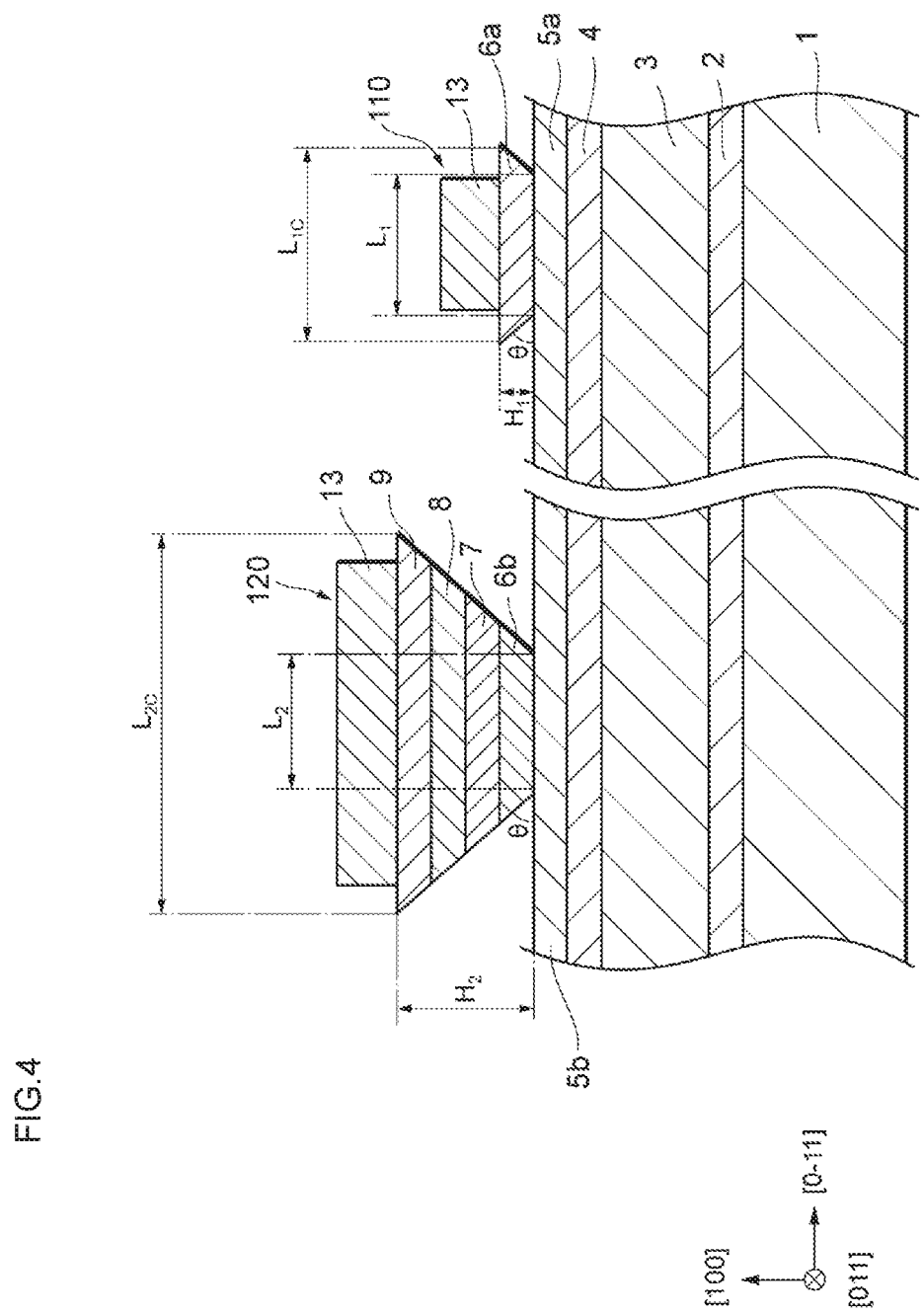
FIG. 4 is a sectional view taken along line 2-2 in FIG. 3.
Figure 5:
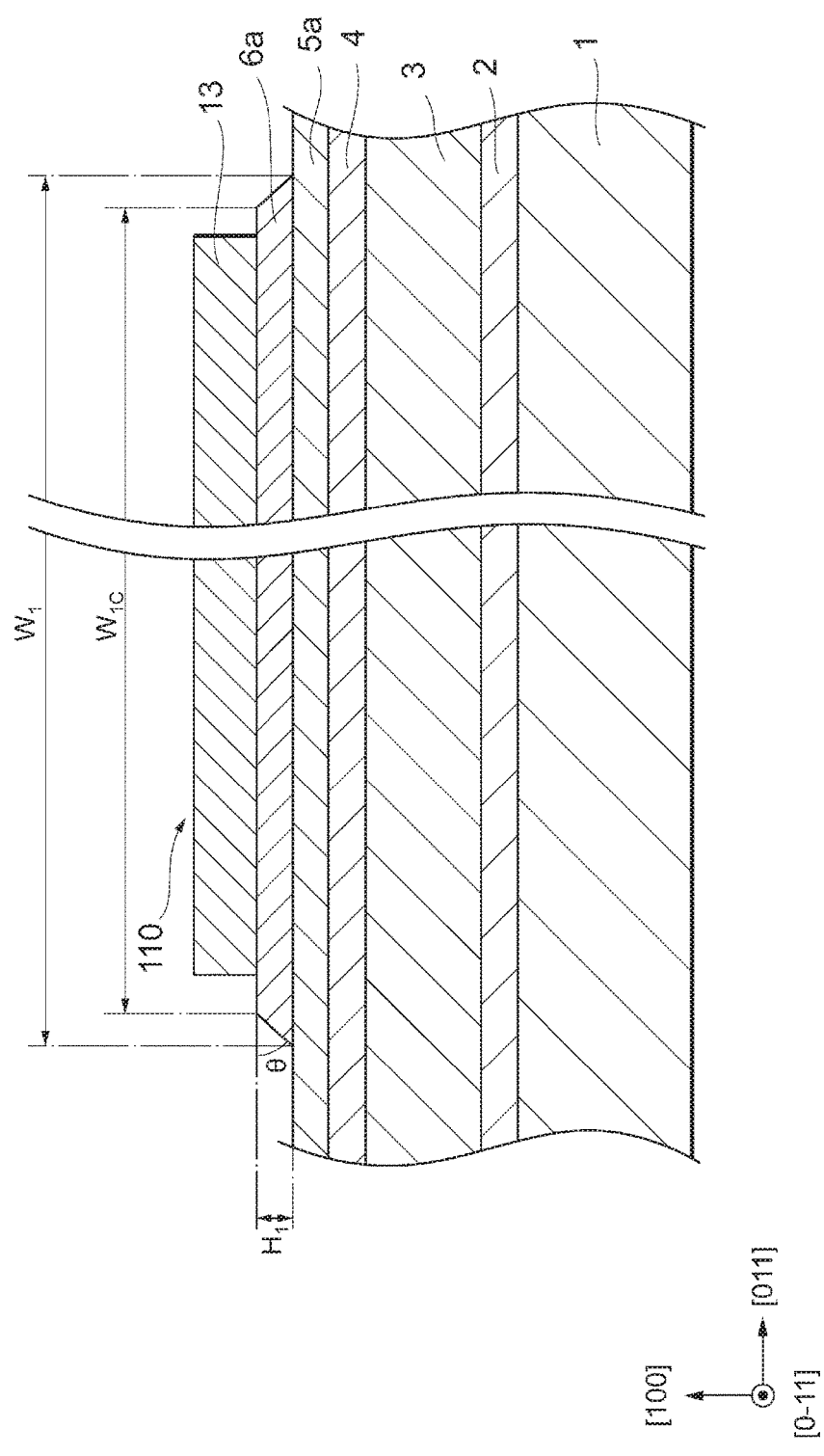
FIG. 5 is a sectional view taken along line 3-3 in FIG. 3.
Figure 6:
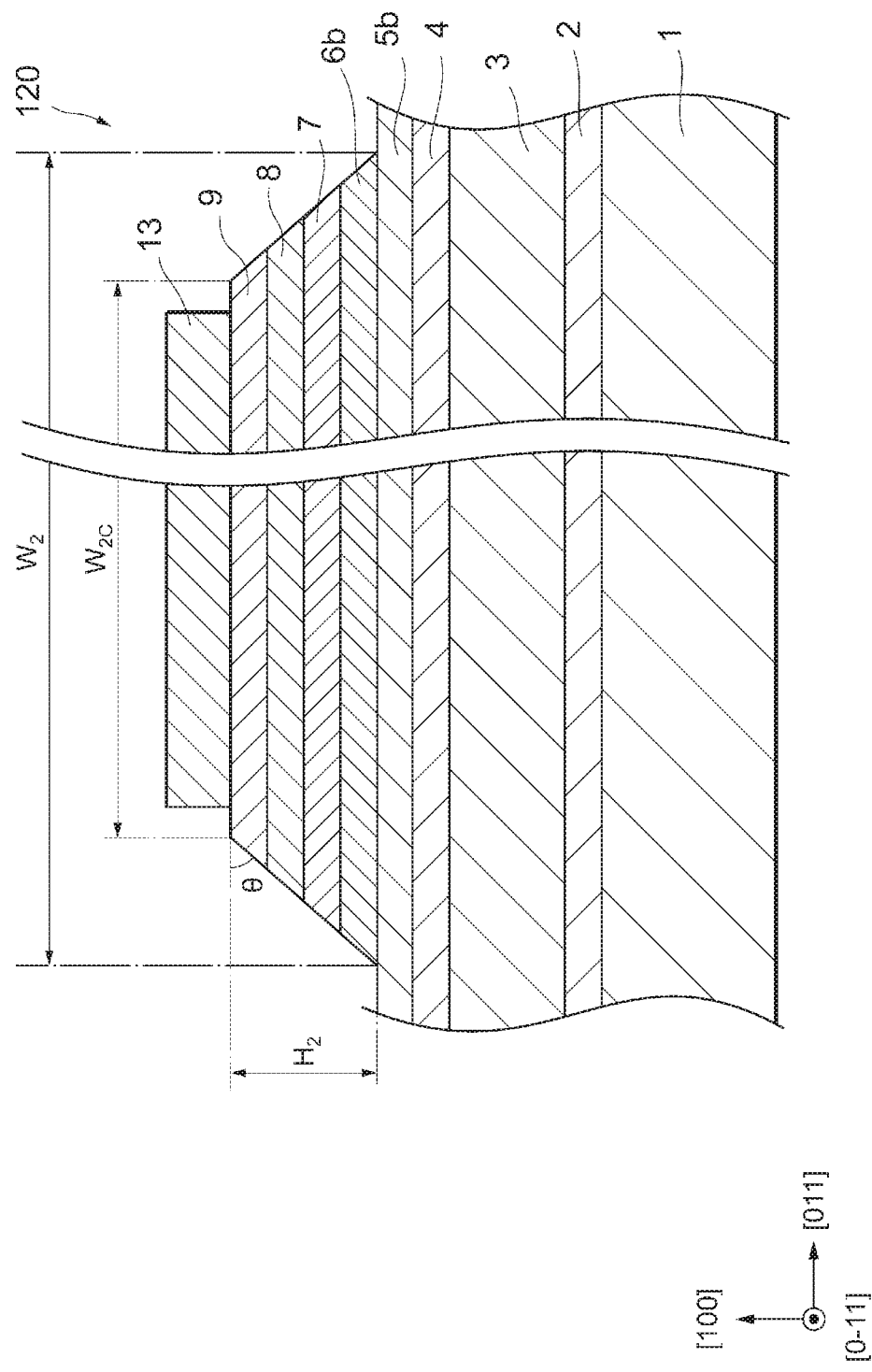
FIG. 6 is a sectional view taken along line 4-4 in FIG. 3.

The configurations of the unit transistors 110 and 120 of the semiconductor device 100A according to the first embodiment will be described below in detail with reference to FIGS. 3 through 6. FIG. 3 is a plan view of the semiconductor device 100A. FIG. 4 is a sectional view taken along line 2-2 in FIG. 3. FIG. 5 is a sectional view taken along line 3-3 in FIG. 3. FIG. 6 is a sectional view taken along line 4-4 in FIG. 3. FIGS. 3 through 6 show one unit transistor 110 and one unit transistor 120 in the semiconductor device 100A after the step shown in FIG. 7E of a manufacturing method for the semiconductor device 100A, which will be discussed later. FIG. 3 is a plan view of the unit transistors 110 and 120 in the plane orientation (100).

In FIGS. 4 through 6, the reason why the cross sections of the layers are in the shape of a mesa having an acute or obtuse angle is that the wet etching rate is different depending on the crystal orientation. The dimensions $L_{1C}$, $L_{2C}$, $L_1$, $L_2$, $W_{1C}$, $W_{2C}$, $W_1$, $W_2$, $H_1$, and $H_2$ (μm) shown in FIGS. 4 through 6 are defined as follows:

$L_{1C}$: the [0-11]-direction dimension of the contact layer 6a of the unit transistor 110 on the surface in the [100] direction;

$L_{2C}$: the [0-11]-direction dimension of the contact layer of the unit transistor 120 on the surface in the [100] direction;

$L_1$: the [0-11]-direction dimension of the contact layer 6a of the unit transistor 110 on the surface in the [−100] direction (the surface which contacts the emitter layer 5a);

$L_2$: the [0-11]-direction dimension of the contact layer 6b of the unit transistor 120 on the surface in the [−100] direction (the surface which contacts the emitter layer 5b);

$W_{1C}$: the [011]-direction dimension of the contact layer 6a of the unit transistor 110 on the surface in the [100] direction;

$W_{2C}$: the [011]-direction dimension of the contact layer 9 of the unit transistor 120 on the surface in the [100] direction;

$W_1$: the [011]-direction dimension of the contact layer 6a of the unit transistor 110 on the surface in the [−100] direction (the surface which contacts the emitter layer 5a);

$W_2$: the [011]-direction dimension of the contact layer 6b of the unit transistor 120 on the surface in the [−100] direction (the surface which contacts the emitter layer 5b);

$H_1$: the dimension of the contact layer 6a of the unit transistor 110 in the [100] direction; and $H_2$: the total dimension of the contact layer 6b, the tunneling barrier layer 7, the emitter ballast resistor layer 8, and the contact layer 9 of the unit transistor 120 in the [100] direction.

The effective emitter area of the unit transistor 110 is $L_1 \times W_1$, while the effective emitter area of the unit transistor 120 is $L_2 \times W_2$. In view of facilitating the IC designing and improving the yield, it is preferable that the emitter areas of the unit transistors be substantially equal to each other (that is, $L_1 \times W_1 \approx L_2 \times W_2$). It is thus preferable that the conditions represented by equations (1) and (2) be satisfied.

$$L_{1C} < L_{2C} \tag{1}$$

$$W_{1C} > W_{2C} \tag{2}$$

More specifically, it is more preferable that the conditions represented by equations (3) and (4) be satisfied.

$$L_{2C} \approx L_{1C} + 1.42 \times (H_2 - H_1) \tag{3}$$

$$W_{2C} \approx W_{1C} - 1.42 \times (H_2 - H_1) \tag{4}$$

If the variations in the manufacturing method are ±1 μm, the conditions represented by equations (5) and (6) may be satisfied instead of equations (3) and (4), respectively.

$$L_{1C} + 1.42 \times (H_2 - H_1) - 1 \le L_{2C} \le L_{1C} + 1.42 \times (H_2 - H_1) + 1 \tag{5}$$

$$W_{1C} - 1.42 \times (H_2 - H_1) - 1 \le W_{2C} \le W_{1C} - 1.42 \times (H_2 - H_1) + 1 \tag{6}$$

Satisfying the above-described conditions allows the semiconductor device 100A to be manufactured at low cost. The unit in equations (1) through (6) is the micrometer (μm). Equations (3) through (6) hold true when the mesa angle θ of the cross sections of the contact layers 6a, 6b, and 9 of the unit transistors 110 and 120 is about 54.7 degrees. The values in equations (3) through (6) may vary in accordance with the mesa angle (see FIGS. 4 through 6).

A manufacturing method for the semiconductor device 100A according to the first embodiment will be described below with reference to FIGS. 7A through 7K. FIGS. 7A through 7K illustrate the individual steps of the manufacturing method. The directions of the cross sections in FIGS. 7A through 7K are similar to the direction taken along line 1-1 in FIG. 1. In the following description, the materials for the elements of the semiconductor device 100A are similar to those of the above-described semiconductor device 100A, and an explanation thereof will thus be omitted.

As shown in FIG. 7A, a sub-collector layer 102, a collector layer 103, a base layer 104, an emitter layer 105, a contact layer 106, a tunneling barrier layer 107, an emitter ballast resistor layer 108, and a contact layer 109 are formed on a semiconductor substrate 101 in this order so as to form a multilayer member 200. The multilayer member 200 includes a first region r1 where a HBT (Q1) will be formed by plural unit transistors 110 (corresponding to the unit transistors 110 shown in FIG. 1) and a second region r2 where a HBT (Q2) will be formed by plural unit transistors 120 (corresponding to the unit transistors 120 shown in FIG. 1). Metalorganic vapor phase epitaxy, for example, may be used for stacking the above-described layers to form the multilayer member 200. The plane orientation (100) of the first main surface of the semiconductor substrate 101 (corresponding to the first main surface of the semiconductor substrate 1 shown in FIG. 1) may be within a range of ±4 degrees.

Figure 7B:
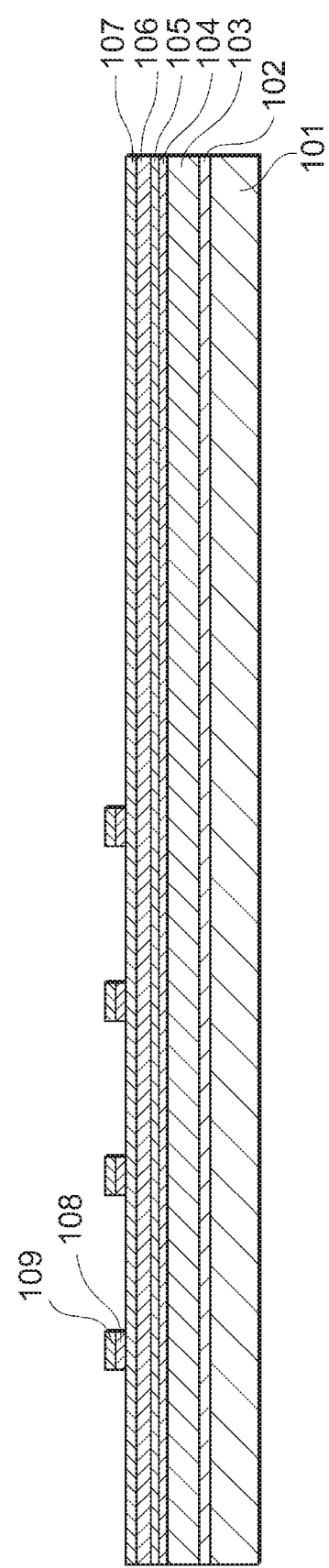

Then, as shown in FIG. 7B, the contact layer 109 and the emitter ballast resistor layer 108 in the first region r1 and those in the second region r2 where unit transistors 120 will not be formed are removed so as to expose the surface of the tunneling barrier layer 107. The exposed surface of the tunneling barrier layer 107 is the main surface in the [100] direction. In the following description, the exposed surfaces are the main surface in the [100] direction. For removing the contact layer 109 and the emitter ballast resistor layer 108, photolithography (photoresist is not shown) or wet etching may be used. The composition of a wet etching solution may be phosphoric acid:hydrogen peroxide solution:water=1:2:40. The use of this wet etching solution can stop etching on the surface of the tunneling barrier layer 107. In this manner, the tunneling barrier layer 107 may have the function of stopping etching.

Figure 7C:
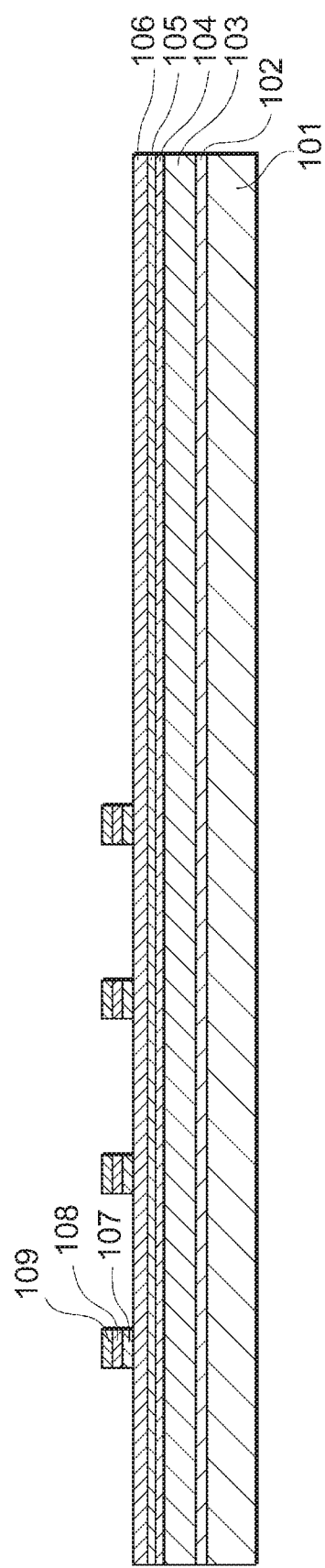

Then, as shown in FIG. 7C, by using the photoresist shown in FIG. 7B as a mask, the tunneling barrier layer 107 exposed on the surface is removed so as to expose the surface of the contact layer 106. For removing the tunneling barrier layer 107, wet etching may be used. As the wet etching solution, hydrochloric acid may be used. The use of this wet etching solution can stop etching on the surface of the contact layer 106.

Figure 7D:
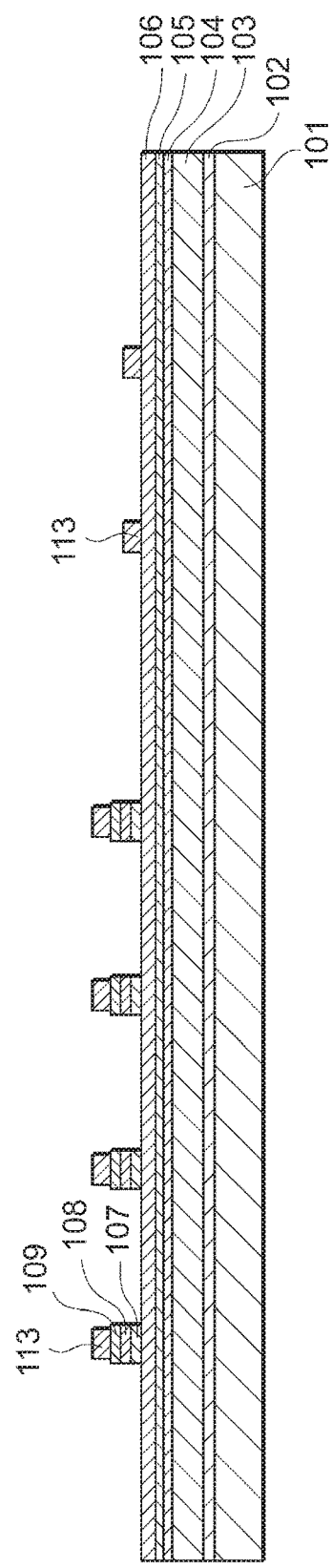

Then, as shown in FIG. 7D, emitter electrodes 113 are formed in the first region r1 where unit transistors 110 will be formed and on the contact layer 109 in the second region r2. For forming the emitter electrodes 113, photolithography, vapor deposition, or a liftoff process may be used.

Then, as shown in FIG. 7E, the contact layer 106 exposed on the surface is removed so as to expose the surface of the emitter layer 105. For removing the contact layer 106, photolithography or wet etching may be used. The composition of a wet etching solution may be phosphoric acid: hydrogen peroxide solution:water=1:2:40. The use of this wet etching solution can stop etching on the surface of the emitter layer 105.

Figure 7F:
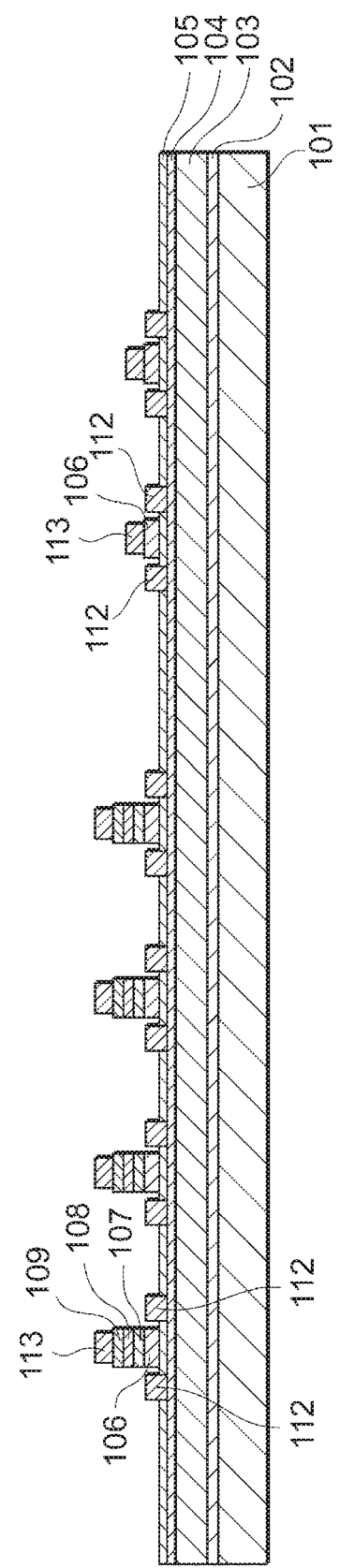

Then, as shown in FIG. 7F, base electrodes 112 are formed on both sides of the contact layer 106 formed in the first region r1 and the second region r2 in such a manner that the base electrodes 112 pass through the emitter layer 105 and reach the base layer 104. For forming the base electrodes 112, photolithography, vapor deposition, or a liftoff process may be used.

Figure 7G:
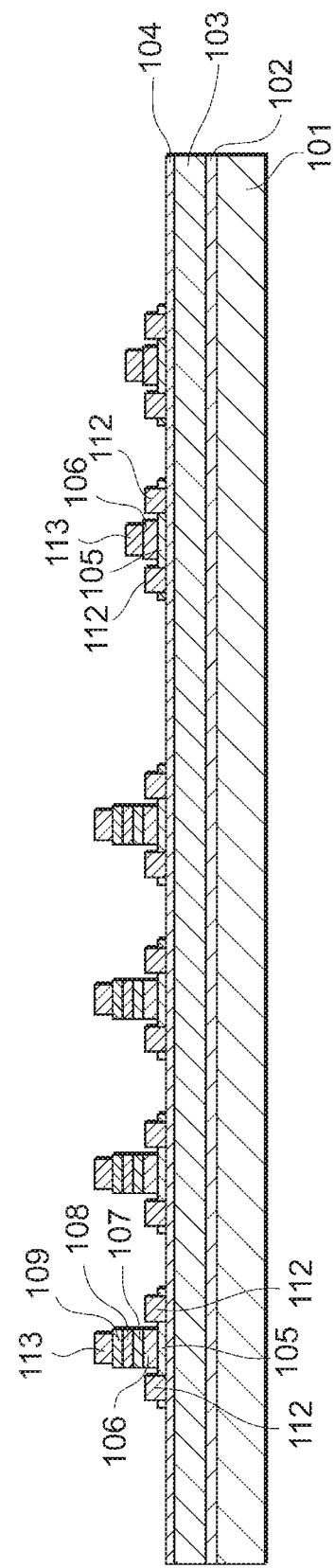

Then, as shown in FIG. 7G, the unnecessary emitter layer 105 is removed so as to expose the surface of the base layer 104. For removing the emitter layer 105, wet etching may be used. As the wet etching solution, hydrochloric acid may be used. The use of this wet etching solution can stop etching on the surface of the base layer 104.

Figure 7H:
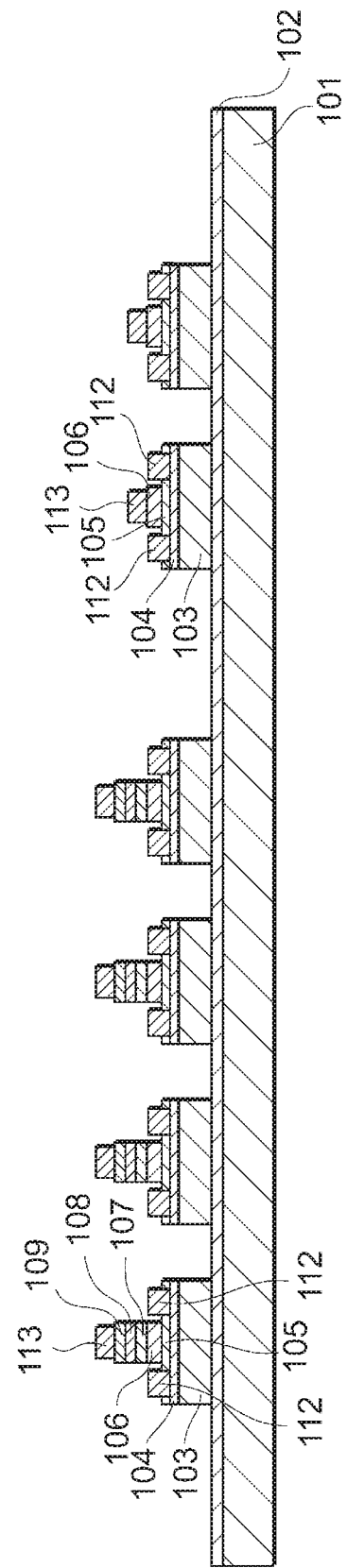

Then, as shown in FIG. 7H, by using the photoresist shown in FIG. 7G as a mask, the base layer 104 and the collector layer 103 are removed so as to expose the surface of the sub-collector layer 102. For removing the base layer 104 and the collector layer 103, wet etching may be used. The composition of a wet etching solution may be phosphoric acid:hydrogen peroxide solution:water=1:2:40. Alternatively, etching may be performed under time control.

Figure 7I:
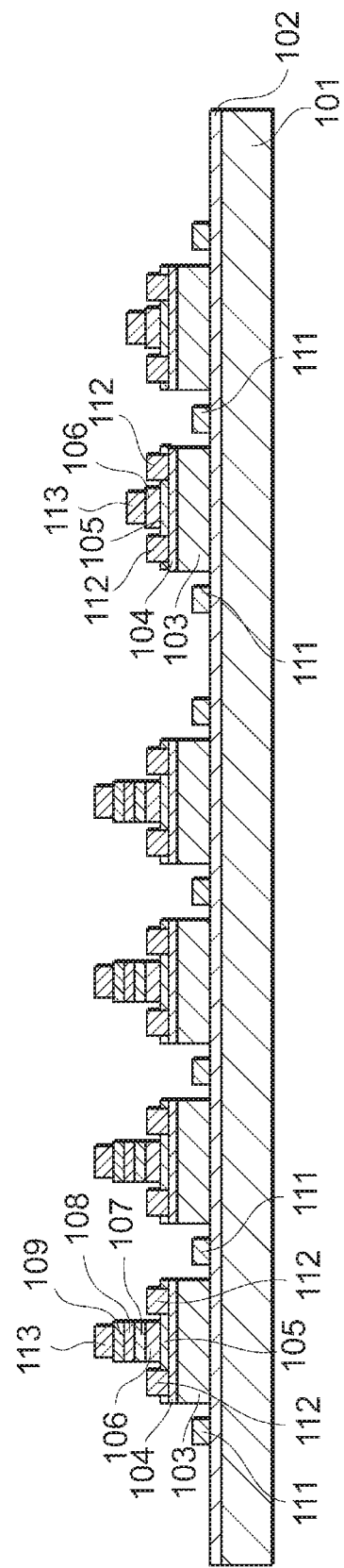

Then, as shown in FIG. 7I, collector electrodes 111 may be formed on predetermined regions on the sub-collector layer 102 by a process similar to that for the base electrodes 112, for example.

Figure 7J:
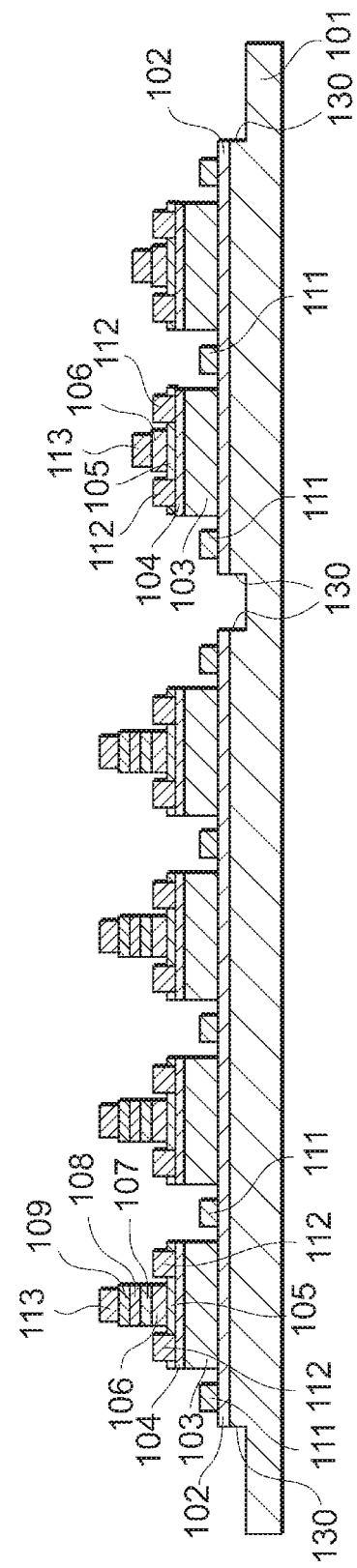

Then, as shown in FIG. 7J, isolation grooves 130 are formed to electrically isolate the first region r1 and the second region r2 from each other. The isolation grooves 130 pass through the sub-collector layer 102 and reach the semiconductor substrate 101. The isolation grooves 130 may be formed by photolithography or wet etching.

Finally, as shown in FIG. 7K, collector wiring patterns 114, base wiring patterns 115, emitter wiring patterns 116, and metal pads 117, 118, and 119 are formed. The collector wiring patterns 114, the base wiring patterns 115, and emitter wiring patterns 116 respectively connect the collector electrodes 111, the base electrodes 112, and the emitter electrodes 113 of the unit transistors. The metal pads 117, 118, and 119 are used for electrically connecting the unit transistors with external devices. The metal pads 118 and 119 respectively correspond to the metal pads 18 and 19 shown in FIG. 1, and are not shown in FIG. 7K. The wiring patterns and metal pads are formed by a process similar to that for the base electrodes 112, for example.

With the above-described manufacturing method, the resulting semiconductor device 100A includes plural unit transistors 110 without the tunneling barrier layer 107, the emitter ballast resistor layer 108, and the contact layer 109 in the first region r1 and plural unit transistors 120 with the tunneling barrier layer 107, the emitter ballast resistor layer 108, and the contact layer 109 in the second region r2. The manufacturing method for the semiconductor device 100A is not restricted to the above-described method.

The measurement results of the semiconductor device 100A according to the first embodiment will be discussed below with reference to FIGS. 8 and 9.

Figure 8:
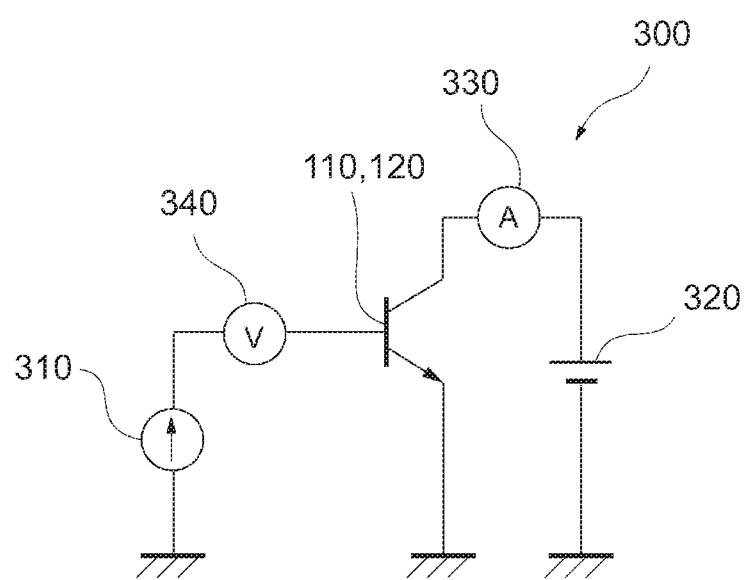
FIG. 8 is a circuit diagram of a measurement circuit for measuring the collector current density in the semiconductor device according to the first embodiment.

FIG. 8 is a circuit diagram of a measurement circuit 300 for measuring the collector current density in the semiconductor device 100A according to the first embodiment. FIG. 9 is a graph illustrating the measurement results of the collector current density in the semiconductor device 100A.

As shown in FIG. 8, the measurement circuit 300 includes a current source 310, a voltage source 320, an ammeter 330, a voltmeter 340, and a unit transistor 110 or 120. In the measurement circuit 300, a predetermined level of current is supplied to the base of the unit transistor 110 or 120 from the current source 310, and a predetermined level of voltage is supplied to the collector of the unit transistor 110 or 120 from the voltage source 320. The ammeter 330 measures the collector current of the unit transistor 110 or 120, while the voltmeter 340 measures the base voltage of the unit transistor 110 or 120. For the measurements, the collector voltage of the unit transistor 110 or 120 is fixed to a predetermined value, and the base current is increased to such a degree as to break the unit transistor 110 or 120. Then, the collector current at which the unit transistor 110 or 120 is broken is divided by the emitter area to calculate the non-destructive maximum collector current density.

Figure 9:
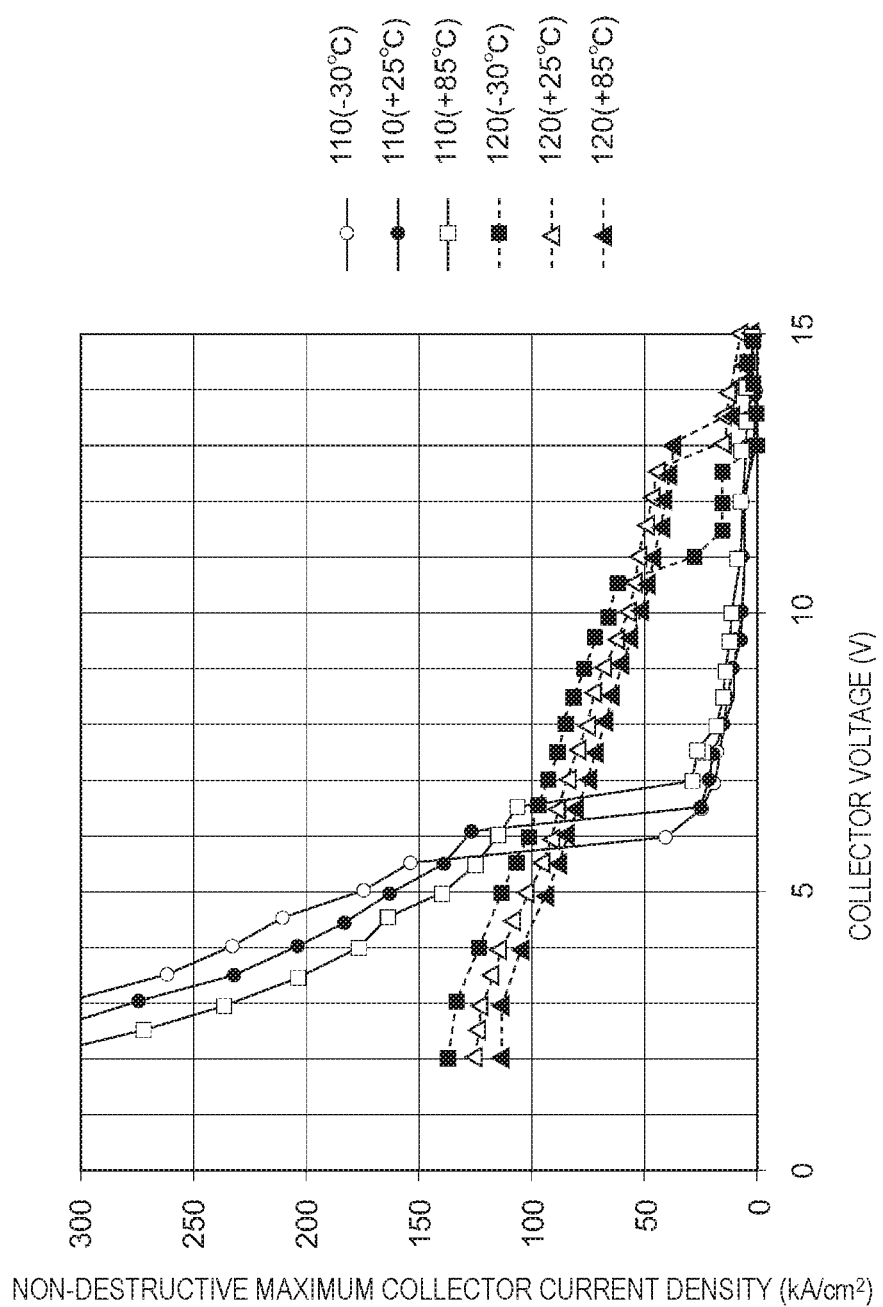
FIG. 9 is a graph illustrating the measurement results of the collector current density in the semiconductor device according to the first embodiment.

In the graph shown in FIG. 9, the vertical axis indicates the non-destructive maximum collector current density (kA/$cm^2$), while the horizontal axis indicates the collector voltage (V). This graph represents the measurement results for each of the unit transistors 110 and 120 when the temperature environment is set to be about −30 degrees, +25 degrees, and +85 degrees. FIG. 9 shows that, when the collector voltage of the unit transistor is about 6 V or lower, the unit transistor 110 can flow a greater amount of current than the unit transistor 120, that is, the unit transistor 110 can make the output power per unit transistor higher than the unit transistor 120. FIG. 9 also shows that, when the collector voltage of the unit transistor is about 6 V or higher, the unit transistor 120 can flow a greater amount of current than the unit transistor 110, that is, the unit transistor 120 can make the output power per unit transistor higher than the unit transistor 110.

Based on the above-described measurement results, when the collector voltage is a predetermined voltage (for example, about 6 V) or lower, the HBT (Q1) is operated, and when the collector voltage is a predetermined voltage (for example, about 6 V) or higher, the HBT (Q1) is switched to the HBT (Q2) and the HBT (Q2) is operated. This configuration makes it possible to increase the non-destructive maximum collector current density when the collector voltage is higher than the predetermined voltage, compared with the configuration in which the HBT (Q1) is solely operated. It is thus possible to provide a semiconductor device exhibiting higher reliability while maintaining the high power-added efficiency both in the high power output and in the low power output.

(Second Embodiment)

Figure 10:
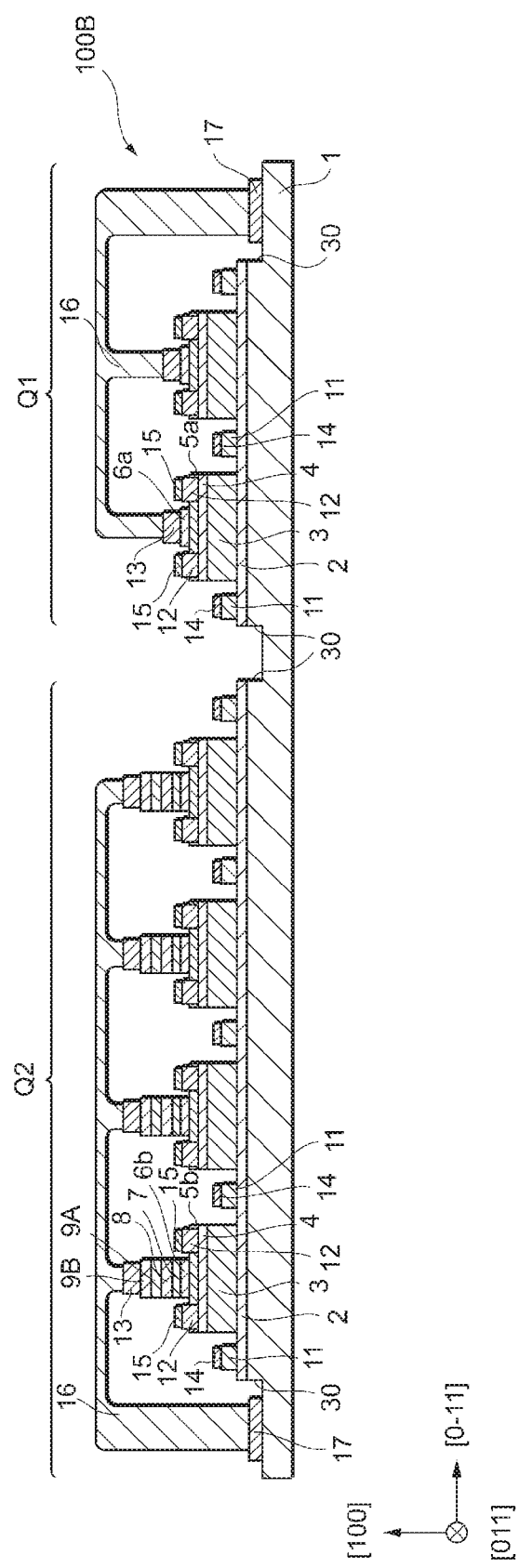
FIG. 10 is a sectional view of a semiconductor device according to a second embodiment of the disclosure.

A semiconductor device 100B according to a second embodiment of the present disclosure will be described below with reference to the sectional view of FIG. 10. The direction of the cross sectional view of the semiconductor device 100B in FIG. 10 is the same as that shown in FIG. 2 taken along line 1-1 in FIG. 1.

The semiconductor device 100B differs from the semiconductor device 100A shown in FIG. 2 in that contact layers 9A and 9B in unit transistors 120 are formed in a double-layered structure, unlike the contact layer 9 of the semiconductor device 100A. More specifically, the contact layers 9A and 9B are stacked on each other on the emitter ballast resistor layer 8 in this order in the [100] direction between the emitter ballast resistor layer 8 and the emitter electrode 13.

In the second embodiment, the contact layer 9A is an n-type semiconductor and contains AlGaAs as the principal component, for example. The contact layer 9A may have a Si-doping concentration of about $5\times10^{18}$ cm$^{-3}$ and a film thickness of about 30 nm. The contact layer 9B is an n-type semiconductor and contains GaAs as the principal component, for example. The contact layer 9B may have a Si-doping concentration of about $5\times10^{18}$ cm$^{-3}$ and a film thickness of about 20 nm.

In the second embodiment, the mole ratio of AlAs in the contact layer 9A becomes smaller as the contact layer 9A approaches the contact layer 9B. More specifically, when the mole ratio of AlAs in the contact layer 9A is represented by X, X linearly changes such that X in the contact layer 9A at the interface with the emitter ballast layer 8 is about 0.33 and X in the contact layer 9A at the interface with the contact layer 9B is about 0. This configuration eliminates the energy discontinuity at the conduction band edge at the interface between the emitter ballast resistor layer 8 and the contact layer 9, which occurs in the semiconductor device 100A shown in FIG. 2, thereby facilitating the flow of electrons. With this configuration, advantages similar to those obtained by the semiconductor device 100A are achieved.

(Third Embodiment)

Figure 11:
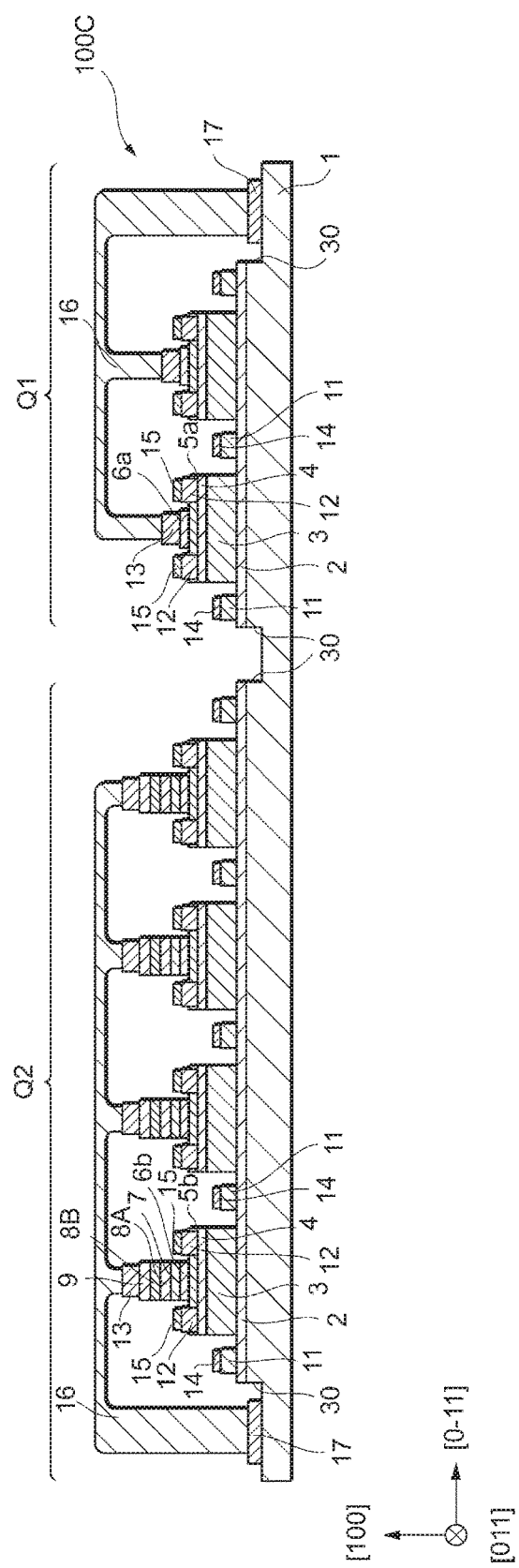
FIG. 11 is a sectional view of a semiconductor device according to a third embodiment of the disclosure.

A semiconductor device 100C according to a third embodiment of the present disclosure will be described below with reference to the sectional view of FIG. 11. The direction of the cross sectional view of the semiconductor device 100C in FIG. 11 is the same as that shown in FIG. 2 taken along line 1-1 in FIG. 1.

The semiconductor device 100C differs from the semiconductor device 100A shown in FIG. 2 in that emitter ballast resistor layers 8A and 8B in unit transistors 120 are formed in a double-layered structure, unlike the emitter ballast resistor layer 8 of the semiconductor device 100A. More specifically, the emitter ballast resistor layers 8A and 8B are stacked on each other on the tunneling barrier layer 7 in this order in the [100] direction between the tunneling barrier layer 7 and the contact layer 9.

In the third embodiment, the emitter ballast resistor layer 8A is an n-type semiconductor and contains AlGaAs as the principal component, for example. The emitter ballast resistor layer 8A may have an AlAs mole ratio of about 0.33, a Si-doping concentration of about $1\times10^{17}$ cm$^{-3}$, and a film thickness of about 120 nm. The emitter ballast resistor layer 8B is an n-type semiconductor and contains AlGaAs as the principal component, for example. The emitter ballast resistor layer 8B may have a Si-doping concentration of about $1\times10^{17}$ cm$^{-3}$ and a film thickness of about 30 nm.

In the third embodiment, the mole ratio of AlAs in the emitter ballast resistor layer 8B becomes smaller as the emitter ballast resistor layer 8B approaches the contact layer 9. More specifically, when the mole ratio of AlAs in the emitter ballast resistor layer 8B is represented by Y, Y linearly changes such that Y in the emitter ballast resistor layer 8B at the interface with the emitter ballast resistor layer 8A is about 0.33 and Y in the emitter ballast resistor layer 8B at the interface with the contact layer 9 is about 0. This eliminates the energy discontinuity at the conduction band edge at the interface between the emitter ballast resistor layer 8 and the contact layer 9, which occur in the semiconductor device 100A shown in FIG. 2, thereby facilitating the flow of electrons. With this configuration, advantages similar to those obtained by the semiconductor device 100A are achieved.

(Application Examples)

An application example of the semiconductor device 100A to a power amplifier circuit will be described below with reference to FIG. 12.

Figure 12:
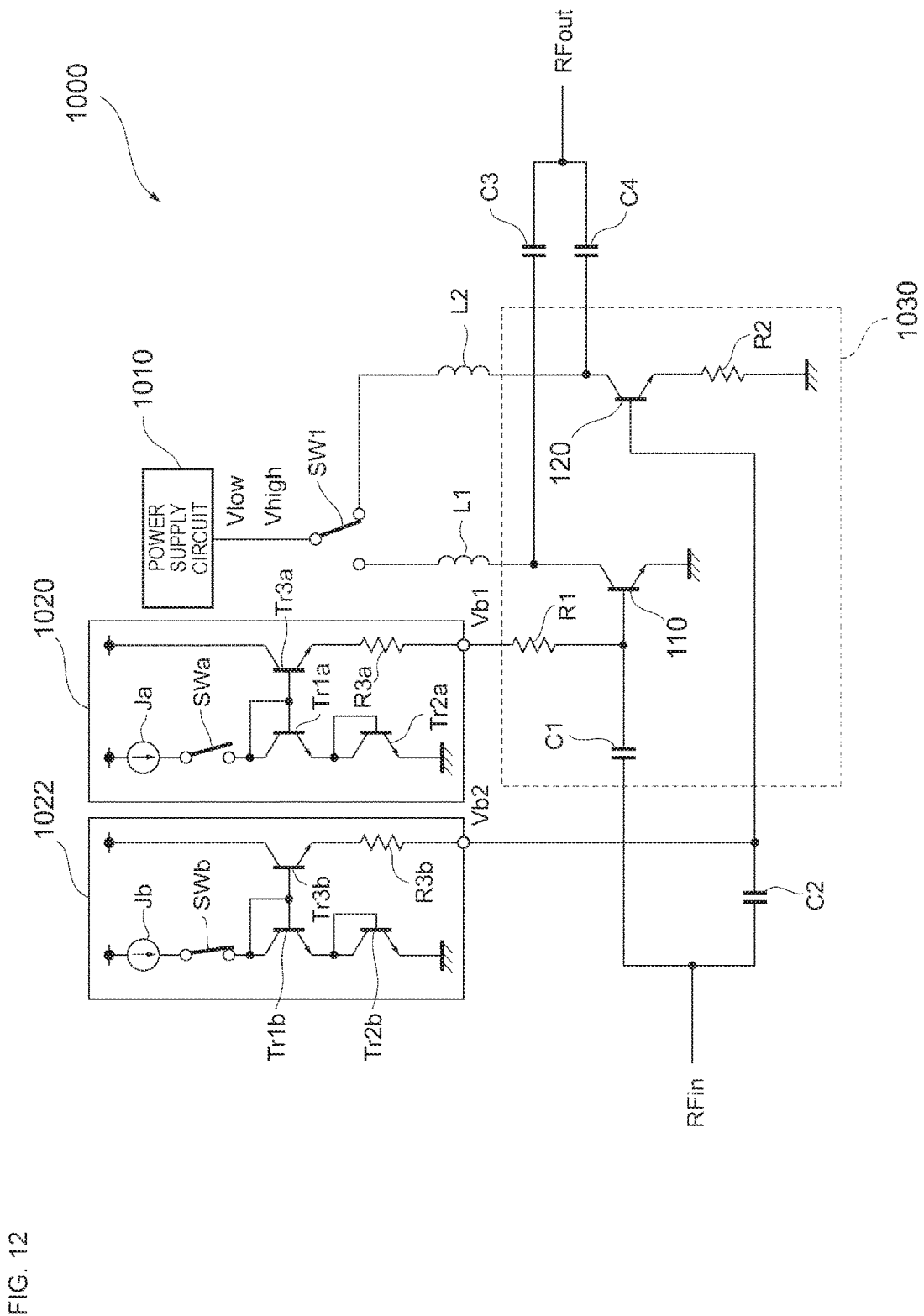
FIG. 12 illustrates an example of the configuration of a power amplifier circuit according to an embodiment of the disclosure.

FIG. 12 illustrates an example of the configuration of a power amplifier circuit 1000 according to an embodiment of the present disclosure. The power amplifier circuit 1000 amplifies a RF signal RFin and outputs an amplified signal RFout. As shown in FIG. 12, the power amplifier circuit 1000 includes unit transistors 110 and 120, resistor elements R1 and R2, capacitors C1 through C4, inductors L1 and L2, a switch SW1, a power supply circuit 1010, and bias circuits 1020 and 1022. For the sake of description, the unit transistors included in a semiconductor device 1030 are designated by like reference numerals used in the above-described semiconductor devices 100A through 100C.

In FIG. 12, each one of the elements included in the semiconductor device 1030 is shown. In actuality, however, the semiconductor device 1030 includes plural unit transistors 110 and plural unit transistors 120 discussed in the first embodiment, and the plural unit transistors 110 are connected in parallel with each other to form a HBT (Q1) (amplifier element), while the plural unit transistors 120 are connected in parallel with each other to form a HBT (Q2) (amplifier element). In this embodiment, in addition to the unit transistors 110 and 120, the capacitors C1 and the resistor elements R1 and R2, for example, are mounted on the same chip (semiconductor device 1030). More specifically, the plural unit transistors 110, the capacitors C1, and the resistor elements R1 form the HBT (Q1), while the plural unit transistors 120 and the resistor elements R2 form the HBT (Q2).

Concerning each of the unit transistors 110 (unit first bipolar transistors), the base receives a RF signal RFin via the capacitor C1, the collector receives a voltage Vlow via the inductor L1, and the emitter is grounded. A bias voltage Vb1 is supplied to the base of the unit transistor 110 via the resistor element R1 (base ballast resistor). With this configuration, the amplified signal RFout generated by amplifying the RF signal RFin is output from the collector of the unit transistor 110. As the number of unit transistors 110, thirty-two unit transistors 110, for example, are connected in parallel with each other.

Concerning each of the unit transistors 120 (unit second bipolar transistors), the base receives the RF signal RFin via the capacitor C2, the collector receives a voltage Vhigh via the inductor L2, and the emitter is grounded via the resistor element R2 (emitter ballast resistor). A bias voltage Vb2 is supplied to the base of the unit transistor 120. With this configuration, the amplified signal RFout generated by amplifying the RF signal RFin is output from the collector of the unit transistor 120. As the number of unit transistors 120, forty-eight unit transistors 120, for example, are connected in parallel with each other.

The power supply circuit 1010 is constituted by a buck-boost converter (buck-boost direct current (DC)-to-DC converter). The power supply circuit 1010 outputs a voltage Vlow (first voltage) lower than a predetermined level (about 6 V, for example) or a voltage Vhigh (second voltage) higher than a predetermined level (about 6 V, for example). The switch SW1 switches between the voltage Vlow and the voltage Vhigh so that the voltage Vlow can be supplied to the collector of the unit transistor 110 and the voltage Vhigh can be supplied to the collector of the unit transistor 120.

The voltages Vlow and Vhigh are collector biases for the unit transistors 110 and 120, respectively. The voltage Vlow may be about 3.5 V, while the voltage Vhigh may be about 8.0 V.

The resistor element R1 is a base ballast resistor of the unit transistor 110, while the resistor element R2 is an emitter ballast resistor of the unit transistor 120. The resistor element R1 is disposed in the vicinity of each of the unit transistors 110 and the resistor element R2 is disposed in the vicinity of each of the unit transistors 120 so that the parallel-connected plural unit transistors can be operated uniformly. That is, the resistor elements R2 correspond to the emitter ballast resistor layer 8 shown in FIG. 2. The unit transistor 120 may also include a base ballast resistor, as in the unit transistor 110.

The capacitors C1 through C4 are coupling capacitors for removing DC components of the RF signal.

The inductors L1 and L2 are choke inductors for suppressing the coupling between a RF signal and the power supply circuit 1010.

The bias circuits 1020 and 1022 respectively generate the bias voltages Vb1 and Vb2 or bias currents to be supplied to the bases of the unit transistors 110 and 120. More specifically, the bias circuit 1020 includes bipolar transistors Tr1*a*, Tr2*a*, and Tr3*a*, a resistor element R3*a*, a switch SWa, and a current source Ja. The configuration of the bias circuit 1022 is similar to that of the bias circuit 1020, and a detailed explanation thereof will thus be omitted.

The bipolar transistors Tr1*a* and Tr2*a* and the current source Ja generate a predetermined level of voltage. More specifically, the collector and the base of the bipolar transistor Tr1*a* are connected to each other (hereinafter such a state will be called "being diode-connected"), a constant current is supplied to the collector of the bipolar transistor Tr1*a* from the current source Ja via the switch SWa, and the emitter is connected to the collector of the bipolar transistor Tr2*a*. The bipolar transistor Tr2*a* is diode-connected, the collector is connected to the emitter of the bipolar transistor Tr1*a*, and the emitter is grounded. With this configuration, a predetermined level of voltage (about 2.6 V, for example) is generated in the base of the bipolar transistor Tr1*a*. Instead of the bipolar transistors Tr1*a* and Tr2*a*, diodes may be used.

Concerning the bipolar transistor Tr3*a*, the collector receives a power supply voltage, the base is connected to the base of the bipolar transistor Tr1*a*, and the emitter is connected to one end of the resistor element R3*a*. When the switch SWa is ON, the bipolar transistor Tr3*a* supplies the bias voltage Vb1 from the emitter to the base of the unit transistor 110 via the resistor element R3*a*.

Switching ON and OFF operations of the switches SWa and SWb of the bias circuits 1020 and 1022 can complementarily switch between the bias voltages Vb1 and Vb2 to be output, thereby turning ON one of the unit transistors 110 and 120 and turning OFF the other one of the unit transistors 110 and 120. This operation allows the unit transistor that is not operated to be turned OFF, thereby reducing power consumption.

With the above-described configuration, when power of the amplified signal RFout is low, the power amplifier circuit 1000 supplies the voltage Vlow to the collector of the unit transistor 110 and the bias voltage Vb1 to the base of the unit transistor 110 so as to turn ON the unit transistor 110, and then amplifies the RF signal RFin. In contrast, when power of the amplified signal RFout is high, the power amplifier circuit 1000 supplies the voltage Vhigh to the collector of the unit transistor 120 and the bias voltage Vb2 to the base of the unit transistor 120 so as to turn ON the unit transistor 120, and then amplifies the RF signal RFin. In this manner, when the collector voltage is equal to or higher than the predetermined level (about 6 V, for example), the unit transistor 120 is solely operated instead of the unit transistor 110. The power amplifier circuit 1000 can thus obtain high output power while reducing the occurrence of a breakdown of the unit transistors. It is thus possible to provide a power amplifier circuit exhibiting higher reliability while maintaining the high power-added efficiency both in the high power output and in the low power output.

The semiconductor device 1030 may be formed as a monolithic microwave integrated circuit (MMIC) by integrating the capacitors C1 and the resistor elements R1 formed in the following manner. The capacitors C1 are constituted by metal-insulator-metal (MIM) capacitors formed by stacking metal/SiN/metal in a multilayered form in this order. The resistor elements R1 are constituted by a thin film using TaN as the principal component.

In the power amplifier circuit 1000 shown in FIG. 12, the semiconductor device 100B or 100C may be used, instead of the semiconductor device 100A.

The exemplary embodiments of the present disclosure have been discussed. The semiconductor devices 100A, 100B, and 100C each include a first bipolar transistor (Q1) and a second bipolar transistor (Q2) on the semiconductor substrate 1. The first bipolar transistor (Q1) includes the emitter layer 5*a*. The second bipolar transistor (Q2) includes the emitter layer 5*b* and the emitter ballast resistor layer 8. When the collector voltage is equal to or lower than a predetermined voltage, the HBT (Q1) is operated. When the collector voltage is equal to or higher than a predetermined voltage, the HBT (Q1) is switched to the HBT (Q2) and the HBT (Q2) is operated. With this configuration, the non-destructive maximum collector current density is increased, compared with the configuration in which the HBT (Q1) is solely operated. It is thus possible to provide a semiconductor device exhibiting higher reliability while maintaining the high power-added efficiency both in the high power output and in the low power output.

The first and second bipolar transistors Q1 and Q2 are not limited to particular transistors, and may be heterojunction bipolar transistors.

As shown in FIG. 2, in the first bipolar transistor Q1, the contact layer 6*a* may be stacked on the emitter layer 5*a*. In the second bipolar transistor Q2, the contact layer 6*b*, the tunneling barrier layer 7, the emitter ballast resistor layer 8, and the contact layer 9 may be stacked on the emitter layer 5*b* in this order. The configurations of the first and second bipolar transistors Q1 and Q2 are not restricted to these configurations.

The material for the semiconductor substrate 1 and the contact layers 6*a*, 6*b*, and 9 is not limited to a particular material, and may be GaAs as the principal component, for example.

The material for the emitter layers 5*a* and 5*b* and the tunneling barrier layer 7 is not limited to a particular material, and may be InGaP as the principal component, for example.

The material for the emitter ballast resistor layer 8 is not limited to a particular material, and may be AlGaAs as the principal component, for example.

The thickness of the tunneling barrier layer 7 is not limited to a particular value, and may be 1 to 10 nm or 1 to 3 nm, for example.

The semiconductor substrate 1 may have a substantially rectangular shape in a plan view of the first main surface. The longitudinal direction of the semiconductor substrate 1 is a [0-11] direction, the widthwise direction thereof is a [011] direction, and a direction normal to the first main surface is a [100] direction. $L_{1C}<L_{2C}$ and $W_{1C}>W_{2C}$ may hold true, where $L_{1C}$ (μm) is a [0-11]-direction dimension of the contact layer 6a on the surface in the [100] direction, $L_{2C}$ (μm) is a [0-11]-direction dimension of the contact layer 9 on the surface in the [100] direction, $W_{1C}$ (μm) is a [011]-direction dimension of the contact layer 6a on the surface in the [100] direction, and $W_{2C}$ (μm) is a [011]-direction dimension of the contact layer 9 on the surface in the [100] direction. This configuration can reduce the manufacturing cost of the semiconductor device.

$L_{1C}+1.42\times(H_2H_1)-1 \leq L_{2C} \leq L_{1C}+1.42\times(H_2-H_1)+1$ and $W_{1C}-1.42\times(H_2-H_1)-1 \leq W_{2C} \leq W_{1C}-1.42\times(H_2-H_1)+1$ may hold true, where $L_1$ (μm) is a [0-11]-direction dimension of the contact layer 6a on the surface opposite the surface in the [100] direction, $L_2$ (μm) is a [0-11]-direction dimension of the contact layer 6b on the surface opposite the surface in the [100] direction, $W_1$ (μm) is a [011]-direction dimension of the contact layer 6a on the surface opposite the surface in the [100] direction, $W_2$ (μm) is a [011]-direction dimension of the contact layer 6b on the surface opposite the surface in the [100] direction, $H_1$ (μm) is a dimension of the contact layer 6a in the [100] direction, and $H_2$ (μm) is a total dimension of the contact layer 6b, the tunneling barrier layer 7, the emitter ballast resistor layer 8, and the contact layer 9 in the [100] direction. This configuration can reduce the manufacturing cost of the semiconductor device.

The first and second bipolar transistors Q1 and Q2 may be amplifier elements that amplify a RF signal.

The power amplifier circuit 1000 includes plural unit transistors 110 and plural unit transistors 120. A voltage Vlow (first voltage) is supplied to the collector of each of the plural unit transistors 110. A voltage Vhigh (second voltage) is supplied to the collector of each of the plural unit transistors 120. It is thus possible to provide a power amplifier circuit exhibiting higher reliability while maintaining the high power-added efficiency both in the high power output and in the low power output.

The above-described preferred embodiments are provided for facilitating the understanding of the disclosure, but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the preferred embodiments by those skilled in the art are also encompassed in the disclosure within the scope and spirit of the disclosure. For example, the elements of the preferred embodiments and the positions, materials, conditions, configurations, and sizes thereof are not restricted to those described in the embodiments and may be changed in an appropriate manner. The elements of the preferred embodiments may be combined within a technically possible range, and configurations obtained by combining the elements of the embodiments are also encompassed in the disclosure within the scope and spirit of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a semiconductor substrate including first and second main surfaces opposing each other;
   a first bipolar transistor that is formed on the first main surface of the semiconductor substrate and includes a first emitter layer; and
   a second bipolar transistor that is formed on the first main surface of the semiconductor substrate and includes a second emitter layer and a resistor layer, the resistor layer being stacked on the second emitter layer in a direction normal to the first main surface;
   wherein:
   in the first bipolar transistor, a first contact layer is stacked on the first emitter layer in the direction normal to the first main surface; and
   in the second bipolar transistor, a second contact layer, a tunneling barrier layer, the resistor layer, and a third contact layer are stacked on the second emitter layer in the direction normal to the first main surface in order of the second contact layer, the tunneling barrier layer, the resistor layer, and the third contact layer.

2. The semiconductor device according to claim 1, wherein the first and second bipolar transistors are heterojunction bipolar transistors.

3. The semiconductor device according to claim 1, wherein the semiconductor substrate and the first, second, and third contact layers contain GaAs as a principal component.

4. The semiconductor device according to claim 1, wherein the first and second emitter layers and the tunneling barrier layer contain InGaP as a principal component.

5. The semiconductor device according to claim 1, wherein the resistor layer contains AlGaAs as a principal component.

6. The semiconductor device according to claim 1, wherein the tunneling barrier layer has a thickness of about 1 to 10 nm.

7. The semiconductor device according to claim 1, wherein the tunneling barrier layer has a thickness of about 1 to 3 nm.

8. The semiconductor device according to claim 1, wherein:
   the semiconductor substrate has a substantially rectangular shape in a plan view of the first main surface;
   a longitudinal direction of the semiconductor substrate is a 0-11 direction, a widthwise direction of the semiconductor substrate is a 011 direction, and the direction normal to the first main surface is a 100 direction; and
   $L_{1C}<L_{2C}$ and $W_{1C}>W_{2C}$ hold true, where:
   $L_{1C}$ (μm) is a 0-11-direction dimension of the first contact layer on a surface in the 100 direction;
   $L_{2C}$ (μm) is a 0-11-direction dimension of the third contact layer on a surface in the 100 direction;
   $W_{1C}$ (μm) is a 011-direction dimension of the first contact layer on the surface in the 100 direction; and
   $W_{2C}$ (μm) is a 011-direction dimension of the third contact layer on the surface in the 100 direction.

9. The semiconductor device according to claim 1, wherein:
   the semiconductor substrate has a substantially rectangular shape in a plan view of the first main surface;
   a longitudinal direction of the semiconductor substrate is a 0-11 direction, a widthwise direction of the semiconductor substrate is a 011 direction, and the direction normal to the first main surface is a 100 direction; and
   $L_{1C}+1.42\times(H_2-H_1)-1 \leq L_{2C} \leq L_{1C}+1.42\times(H_2-H_1)+1$ and $W_{1C}-1.42\times(H_2-H_1)\ -1 \leq W_{2C} \leq W_{1C}-1.42\times(H_2-H_1)+1$ hold true, where:

$L_{1C}$ (μm) is a 0-11-direction dimension of the first contact layer on a surface in the 100 direction;

$L_{2C}$ (μm) is a 0-11-direction dimension of the third contact layer on a surface in the 100 direction;

$W_{1C}$ (μm) is a 011-direction dimension of the first contact layer on the surface in the 100 direction;

$W_{2C}$ (μm) is a 011-direction dimension of the third contact layer on the surface in the 100 direction;

$H_1$ (μm) is a dimension of the first contact layer in the 100 direction; and $H_2$ (μm) is a total dimension of the second contact layer, the tunneling barrier layer, the resistor layer, and the third contact layer in the 100 direction.

10. The semiconductor device according to claim 1, wherein the resistor layer has a higher resistivity than the second contact layer.

11. A power amplifier circuit comprising:
the semiconductor device according to claim 1,
wherein the first and second bipolar transistors are amplifier elements that amplify a radio frequency signal.

12. The power amplifier circuit according to claim 11, wherein:
the first bipolar transistor includes a plurality of unit first bipolar transistors;
the second bipolar transistor includes a plurality of unit second bipolar transistors;
a first voltage is supplied to a collector of each of the plurality of unit first bipolar transistors; and
a second voltage is supplied to a collector of each of the plurality of unit second bipolar transistors, the second voltage being higher than the first voltage.

* * * * *